United States Patent [19]
Jetton et al.

[11] Patent Number: 6,028,995
[45] Date of Patent: Feb. 22, 2000

[54] METHOD OF DETERMINING DELAY IN LOGIC CELL MODELS

[75] Inventors: Mark W. Jetton; Anura P. Jayasumana, both of Fort Collins, Colo.

[73] Assignee: LSI Logic Corporation, Milpitas, Calif.

[21] Appl. No.: 09/052,914

[22] Filed: Mar. 31, 1998

[51] Int. Cl.[7] .................................................. G06F 9/455
[52] U.S. Cl. .................................... 395/500.4; 395/500.07
[58] Field of Search .......................... 395/500.07, 500.34, 395/500.35, 500.36, 500.4, 500.12, 500.44; 324/681

[56] References Cited

U.S. PATENT DOCUMENTS

| | | | |
|---|---|---|---|
| 4,698,760 | 10/1987 | Lembach et al. | 364/490 |
| 4,795,964 | 1/1989 | Mahant-Shetti et al. | 324/681 |
| 5,258,919 | 11/1993 | Yamanouchi et al. | 395/500.12 |
| 5,274,568 | 12/1993 | Blinne et al. | 364/489 |
| 5,379,231 | 1/1995 | Pillage et al. | 364/488 |
| 5,396,615 | 3/1995 | Tani | 395/500.4 |
| 5,461,576 | 10/1995 | Tsay et al. | 364/490 |
| 5,493,516 | 2/1996 | Broomhead et al. | 364/553 |
| 5,500,808 | 3/1996 | Wang | 364/578 |
| 5,625,803 | 4/1997 | McNelly et al. | 395/500.35 |
| 5,692,160 | 11/1997 | Sarin | 395/500.44 |

*Primary Examiner*—Kevin J. Teska
*Assistant Examiner*—Dan Fiul

[57] ABSTRACT

A logic-cell model accounts for nonlinear effects in determining propagation delay, thereby providing improved accuracy as compared to existing models, particularly when rise/fall times exceed several nanoseconds. Given a logic cell of the type wherein delay is a function of rise/fall time (TRL) and load capacitance (CL), the method involves choosing a plurality of discrete simulation points associated with the delay, each point also being a function of TRF and CL, after which the delay is determined in accordance with the chosen simulation points. One or more of the simulation points are preferably chosen in conjunction with both the linear and nonlinear regions of the TRL/CL space to ensure accuracy for a wide range of TRL and/or CL values. In the event of an identifiable or discontinuous transition between the linear and nonlinear regions, a discrete simulation point is also chosen with respect to the transition area. Based upon the simulation points, the invention is used to determine a plurality of constants which are then, in turn, used to solving for propagation delay on a more accurate basis. In this respect, the propagation delay, TD, may be determined in accordance with the relation $$TD = A + B*CL + C*TRF + E(TRF, CL),$$

where A, B, C and E are constants from the simulation points, and with E(TRF,CL) representing a correction factor associated with the nonlinear effects.

10 Claims, 22 Drawing Sheets

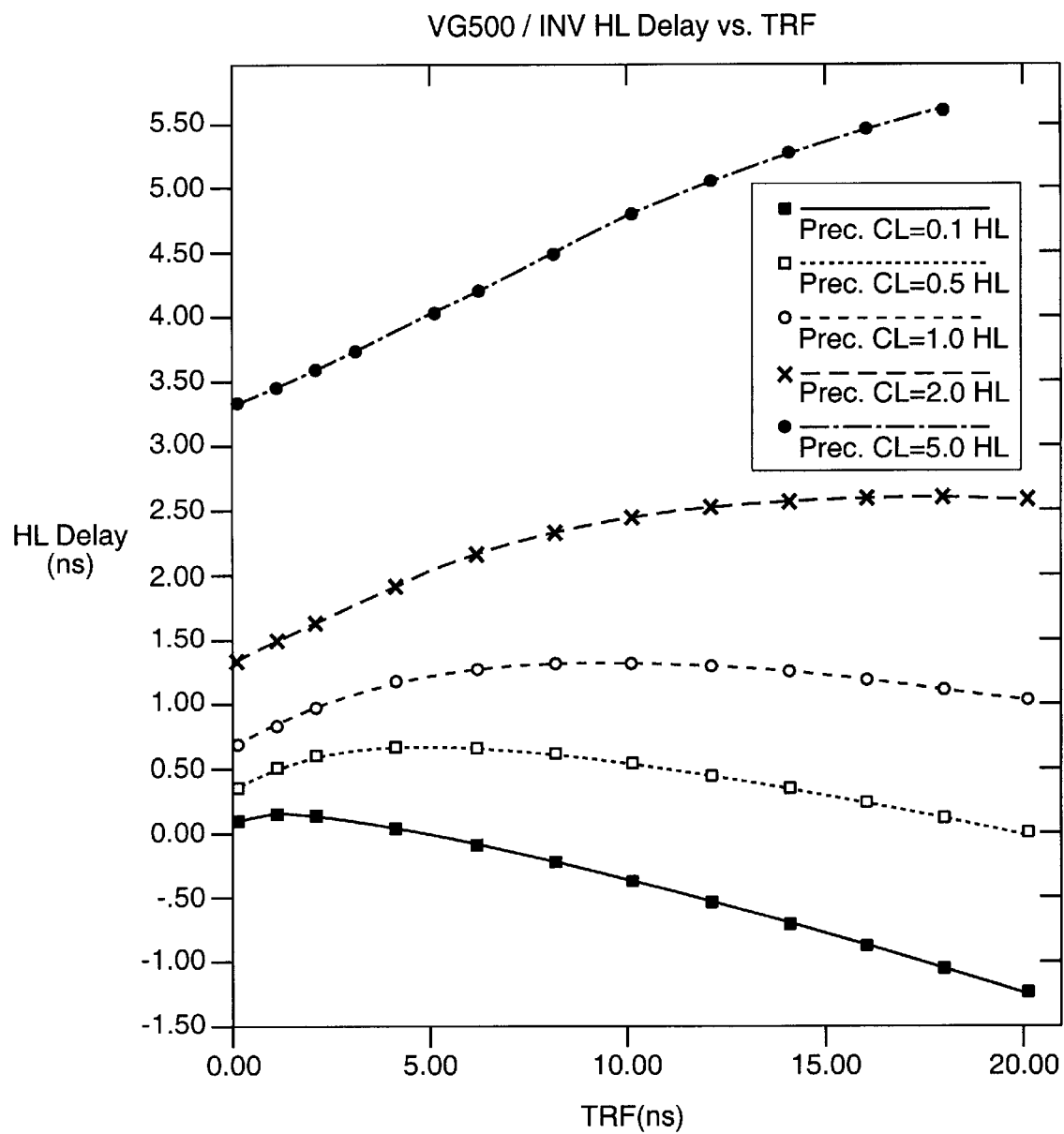
FIG._1

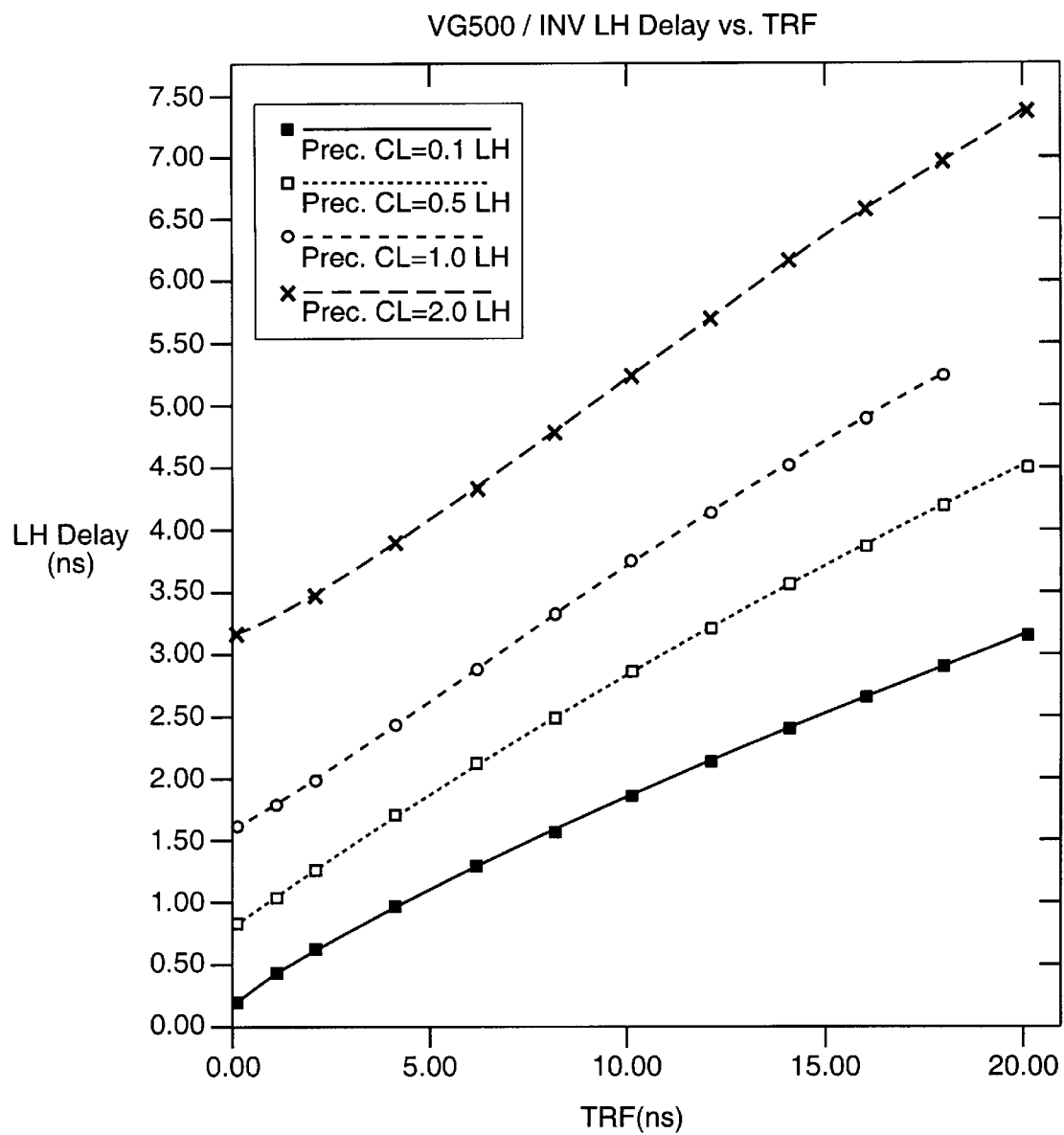
FIG._2

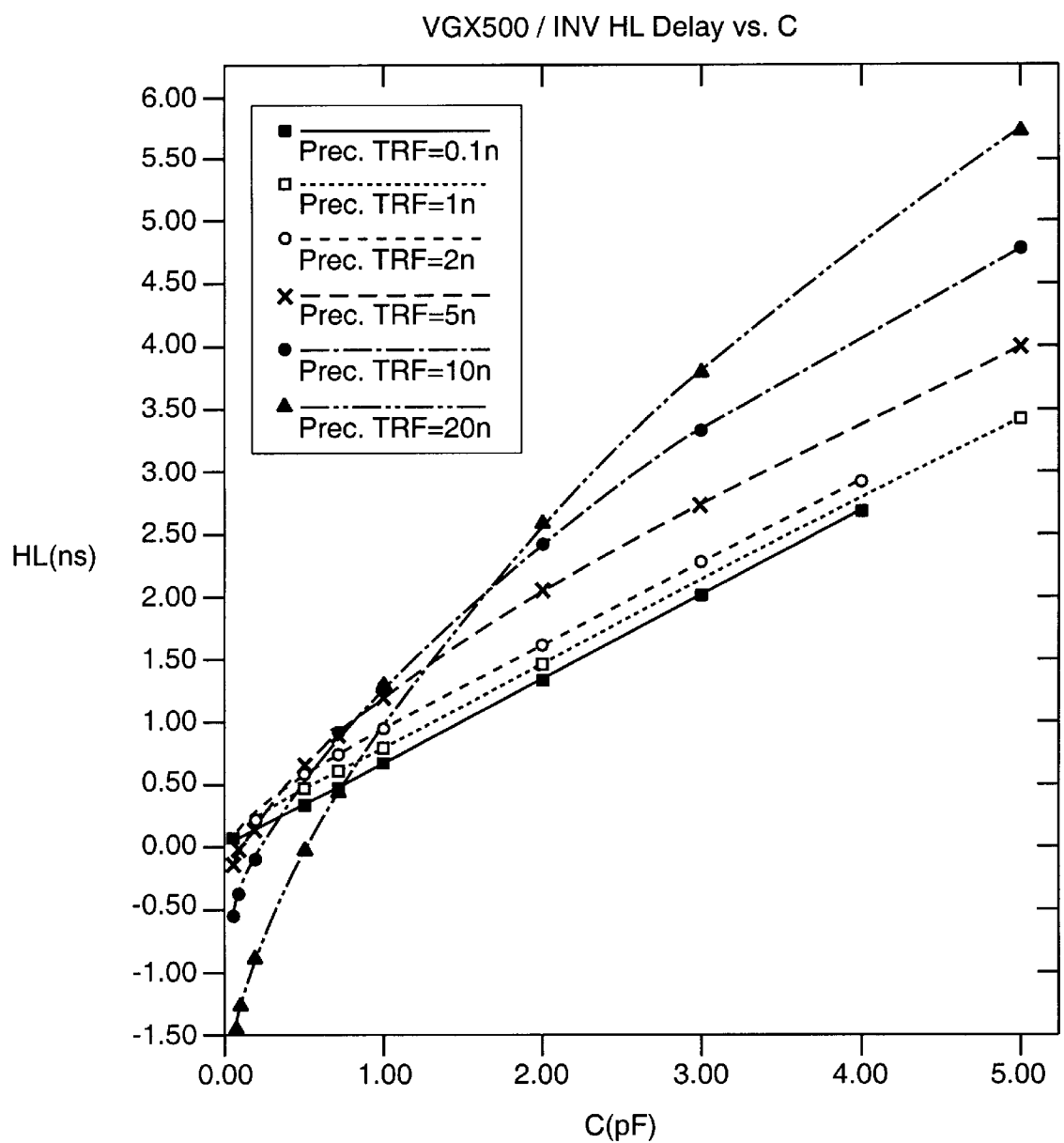
FIG._3

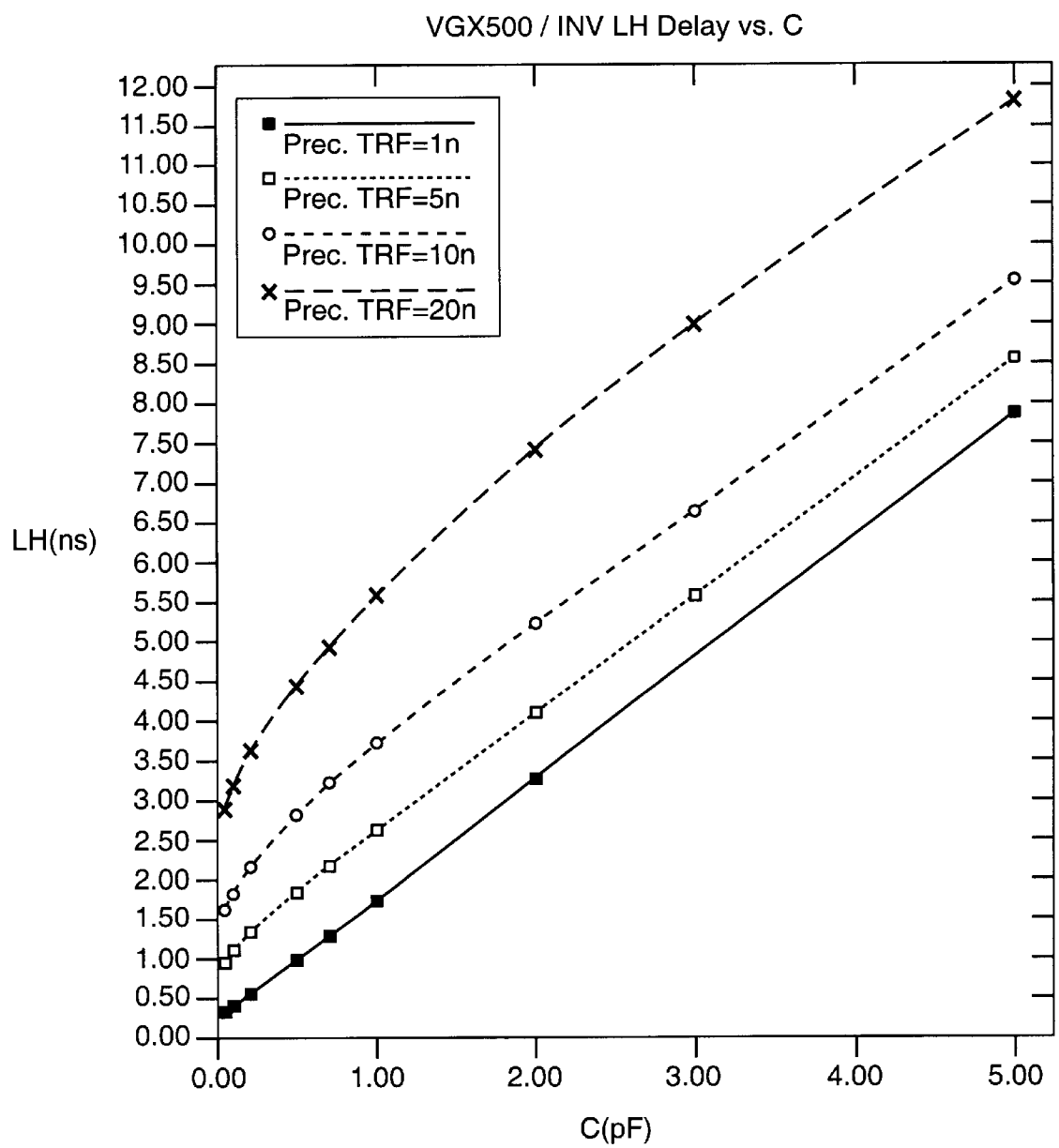
FIG._4

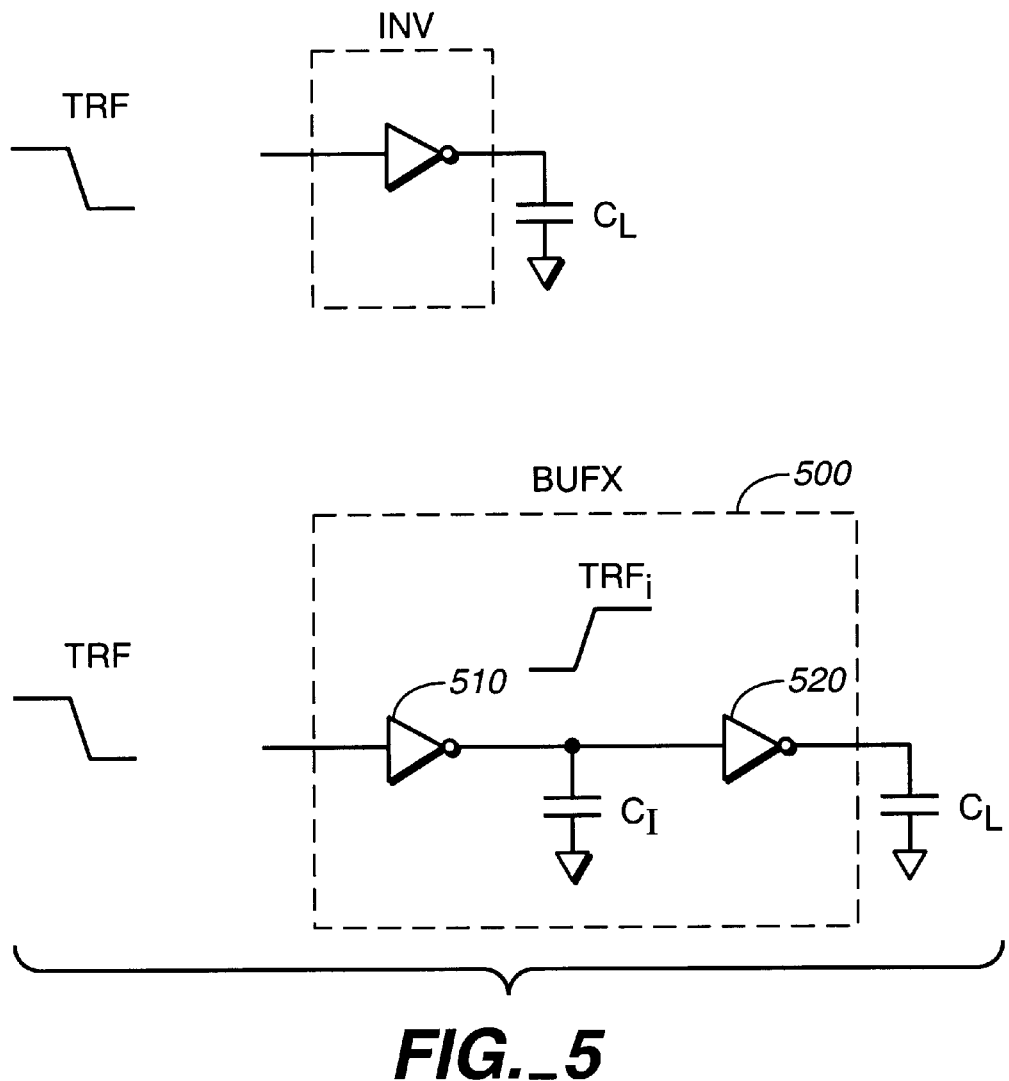
FIG._5

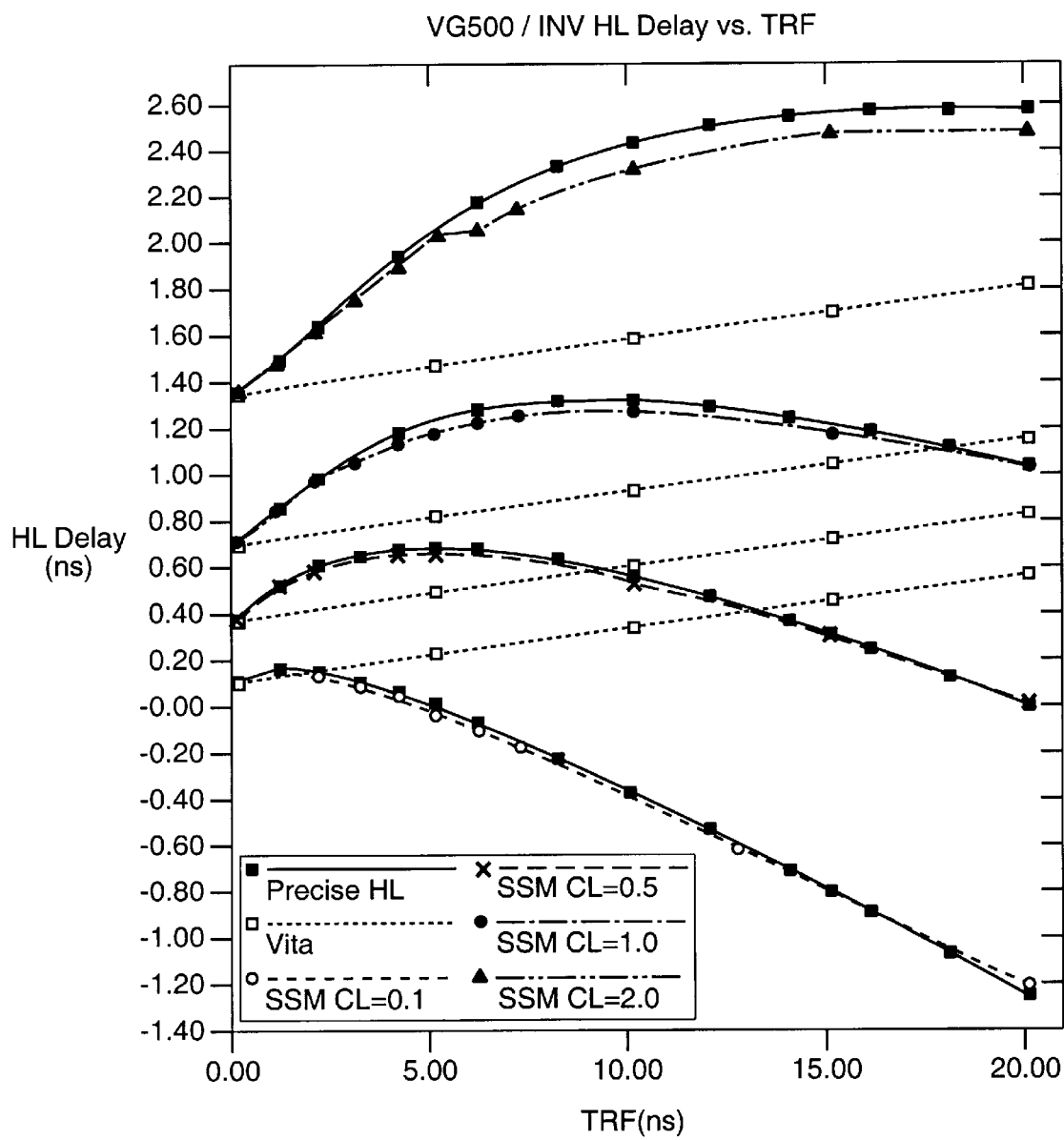
FIG._6

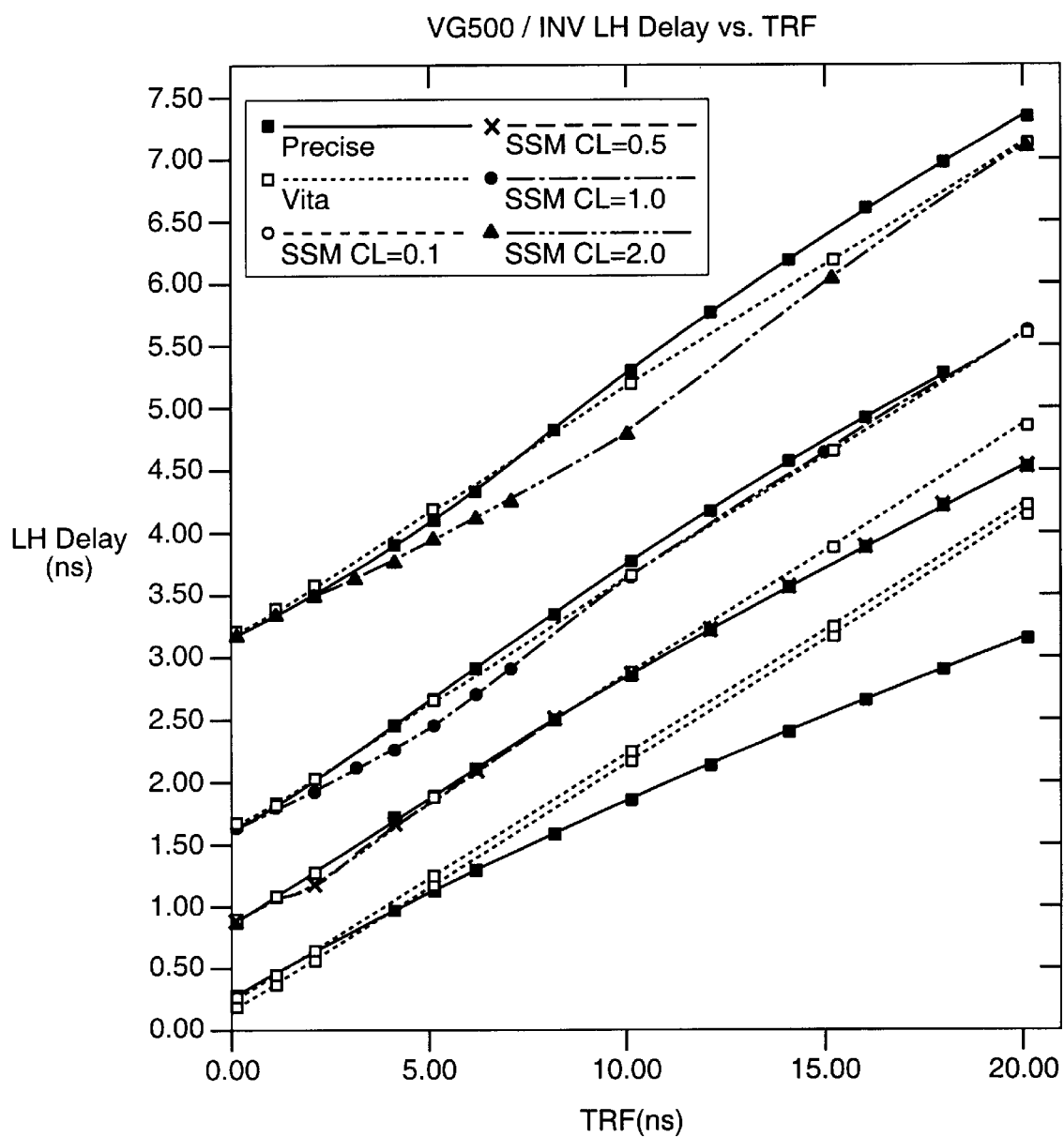
FIG._7

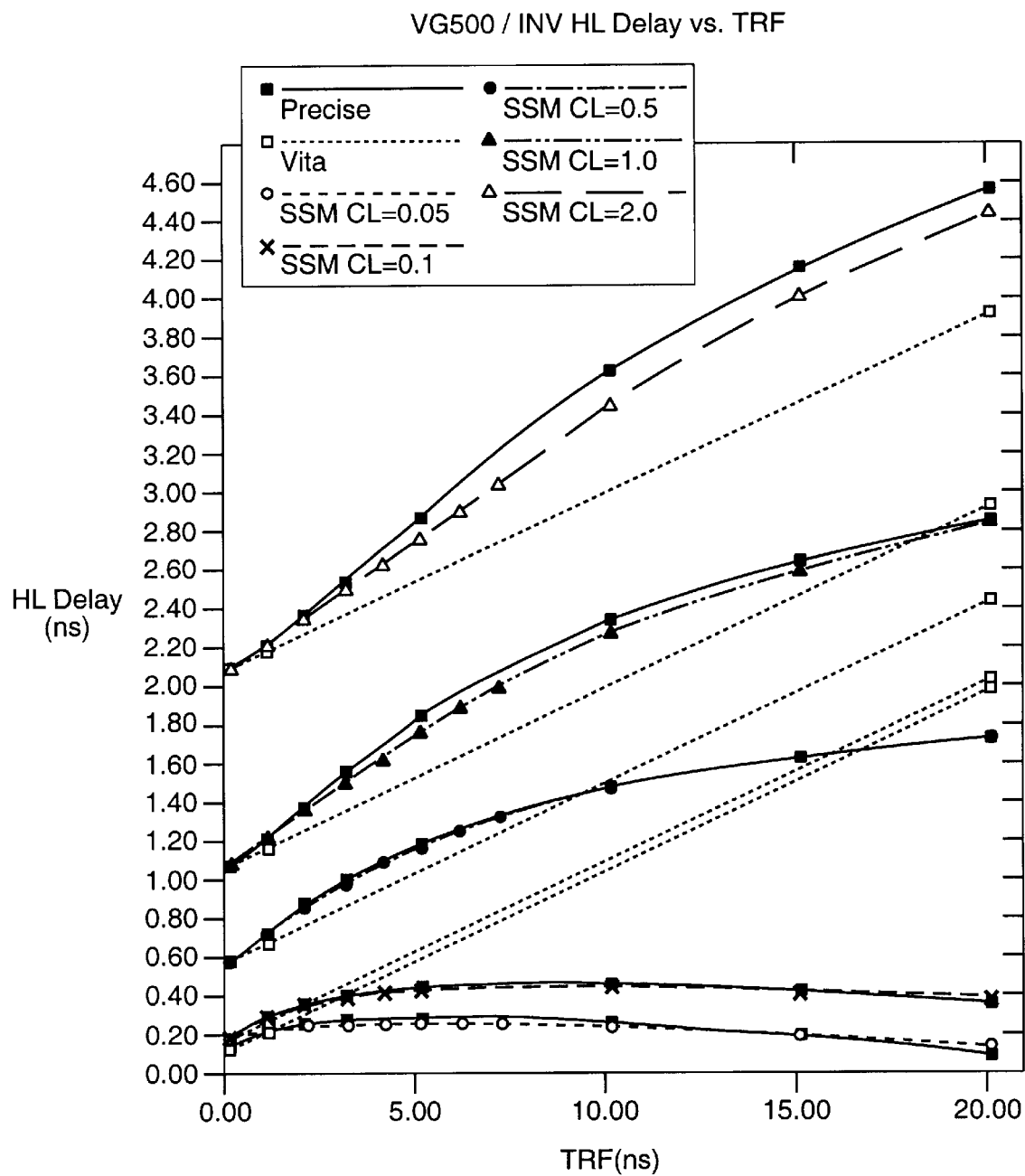
FIG._8

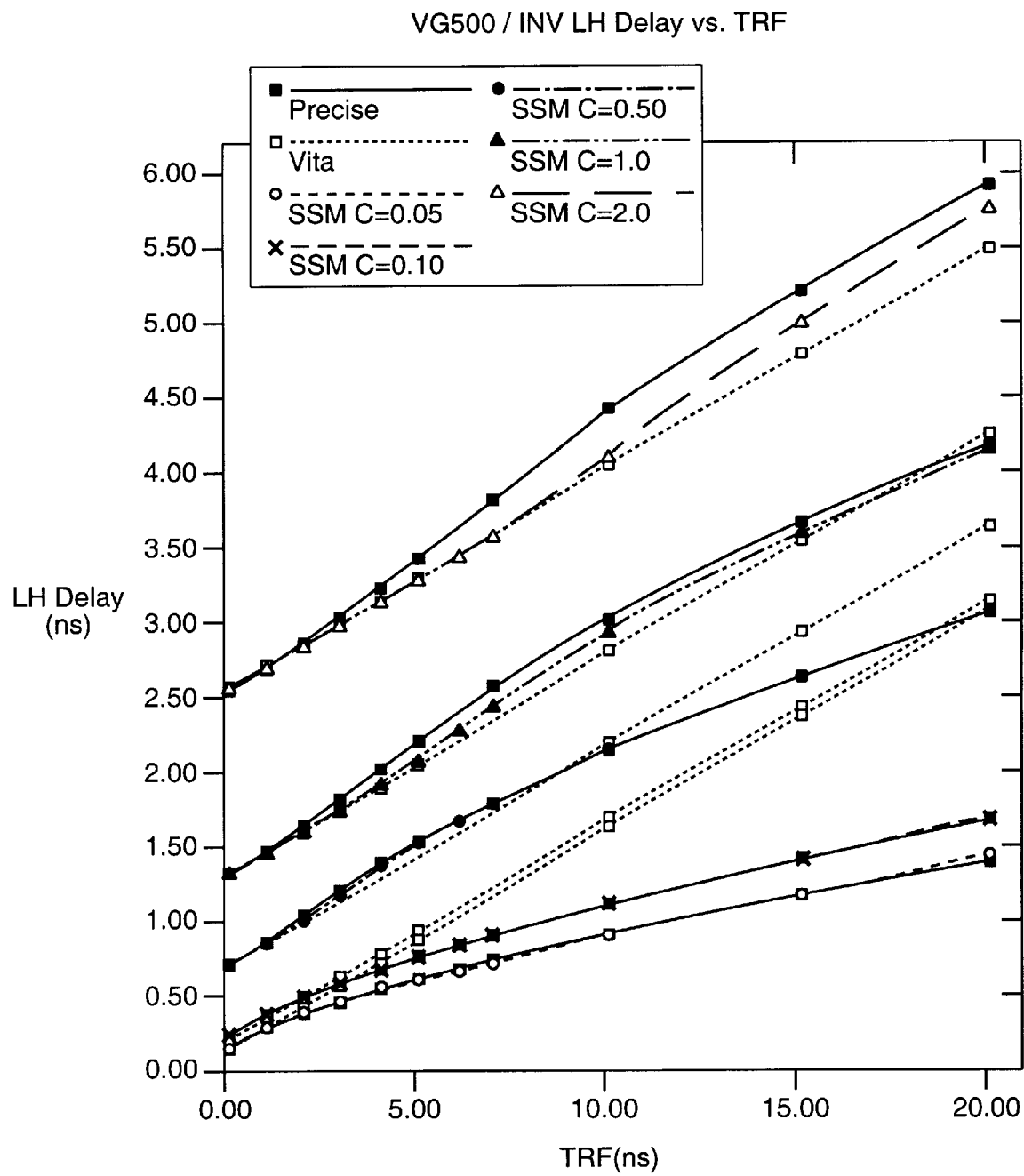
FIG._9

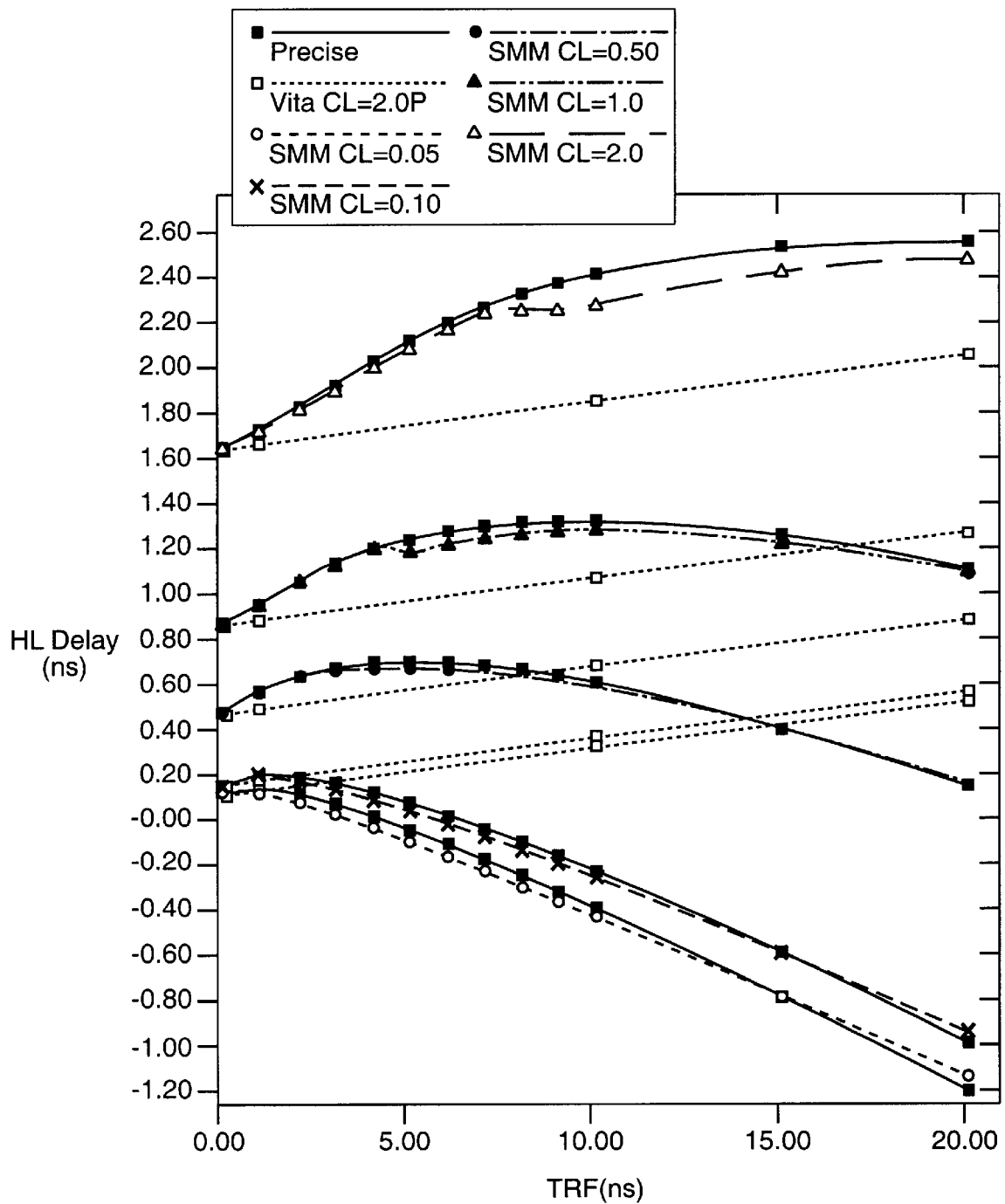
FIG._10

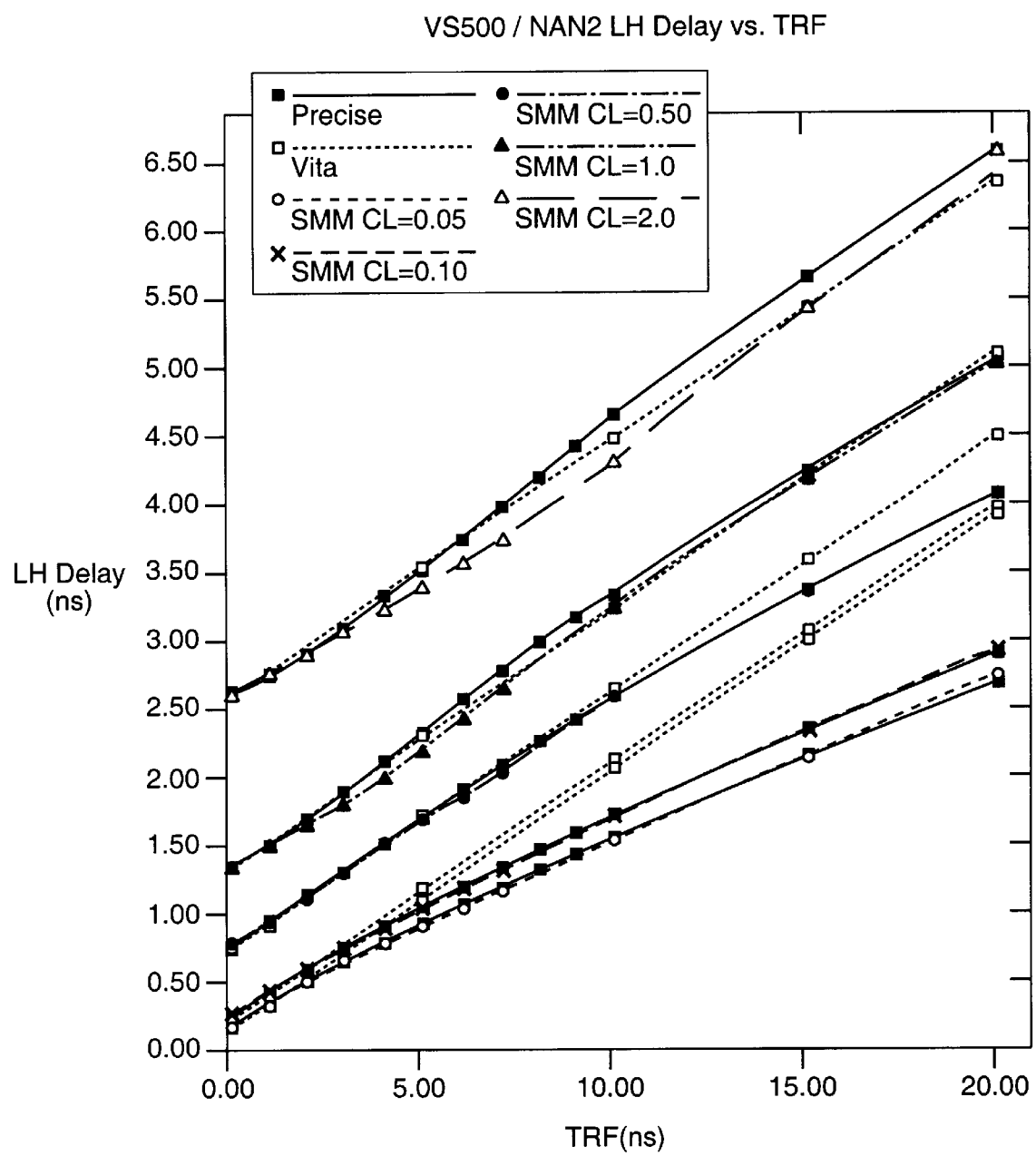
FIG._11

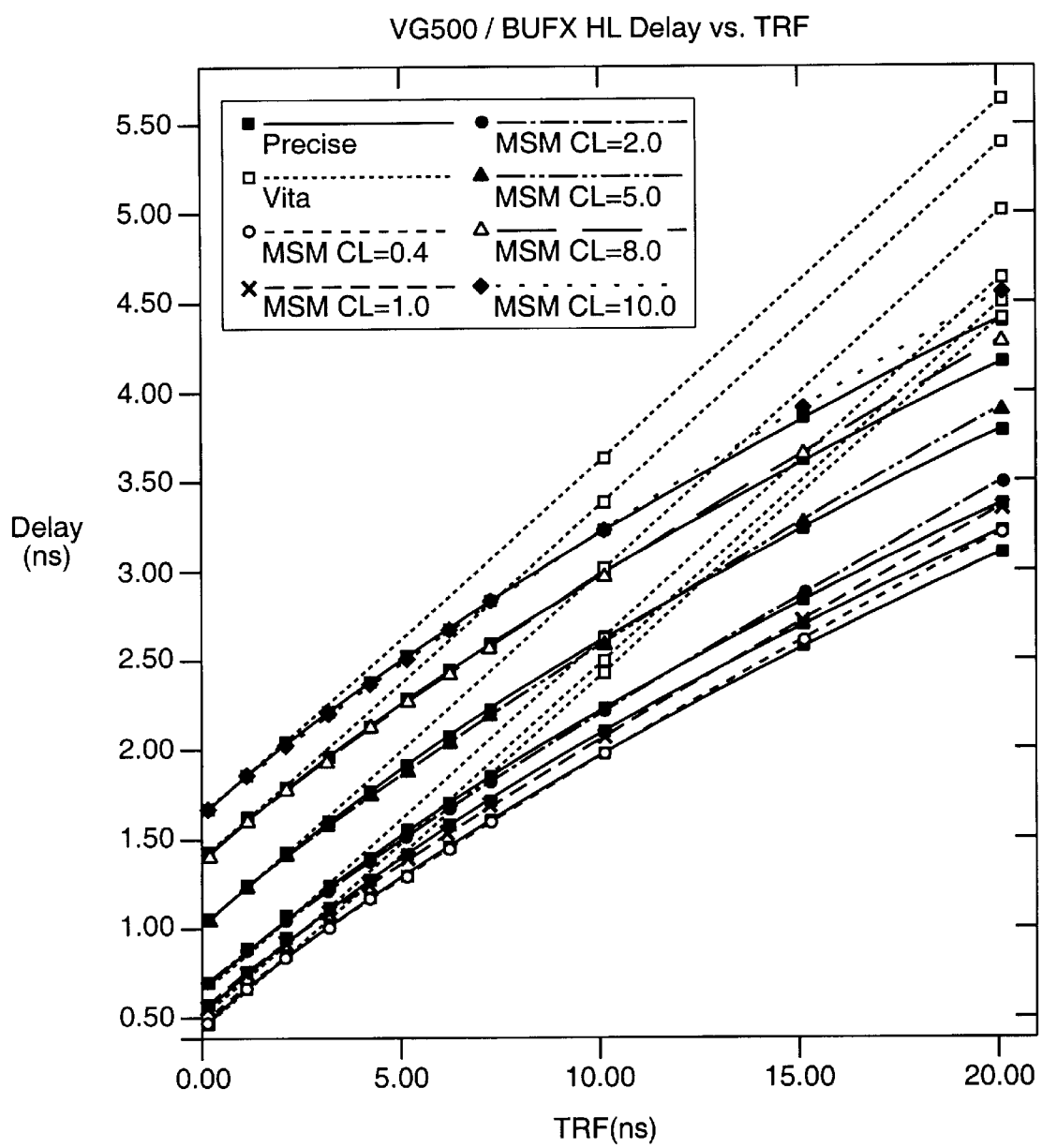
FIG._12

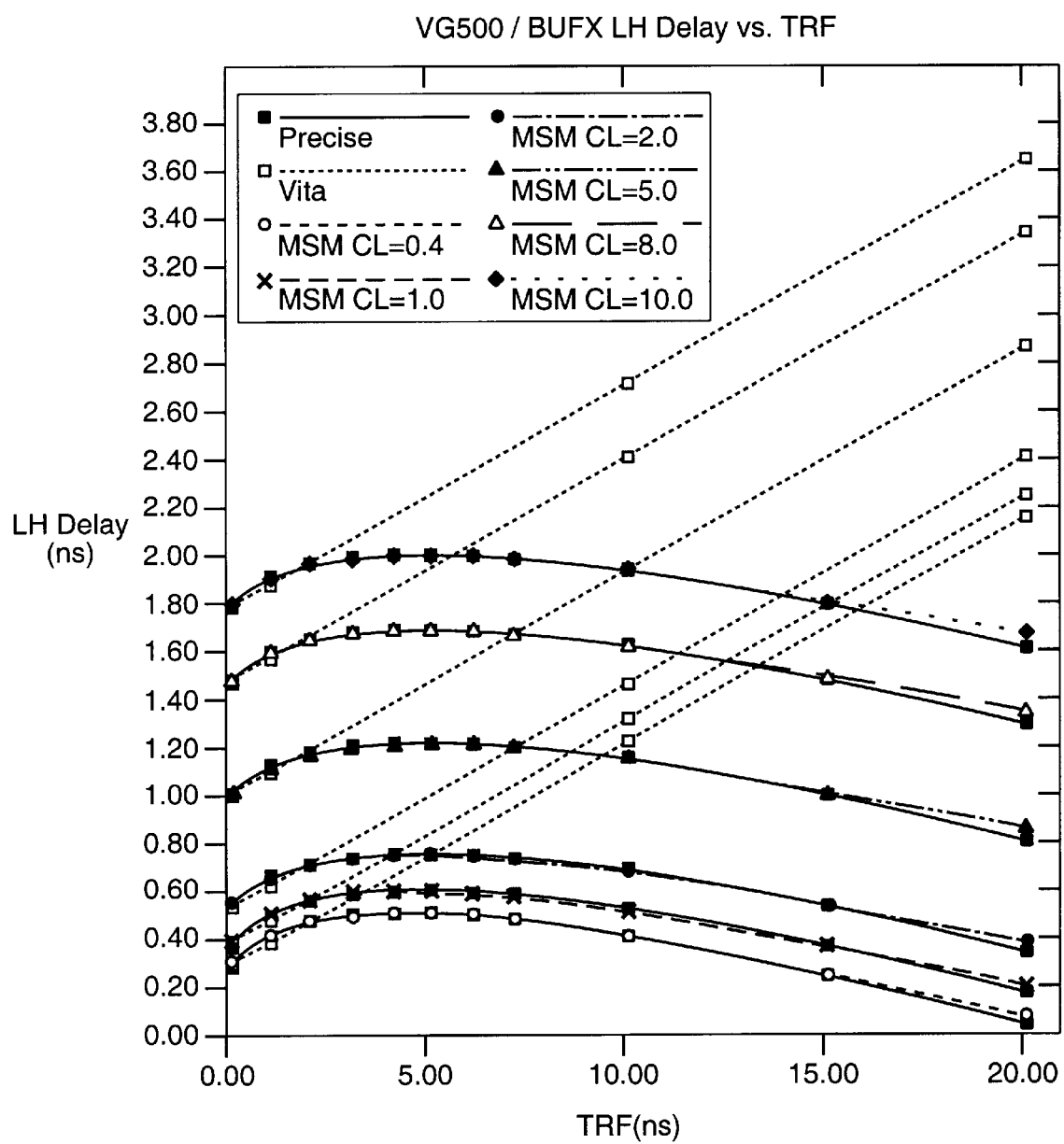
FIG._13

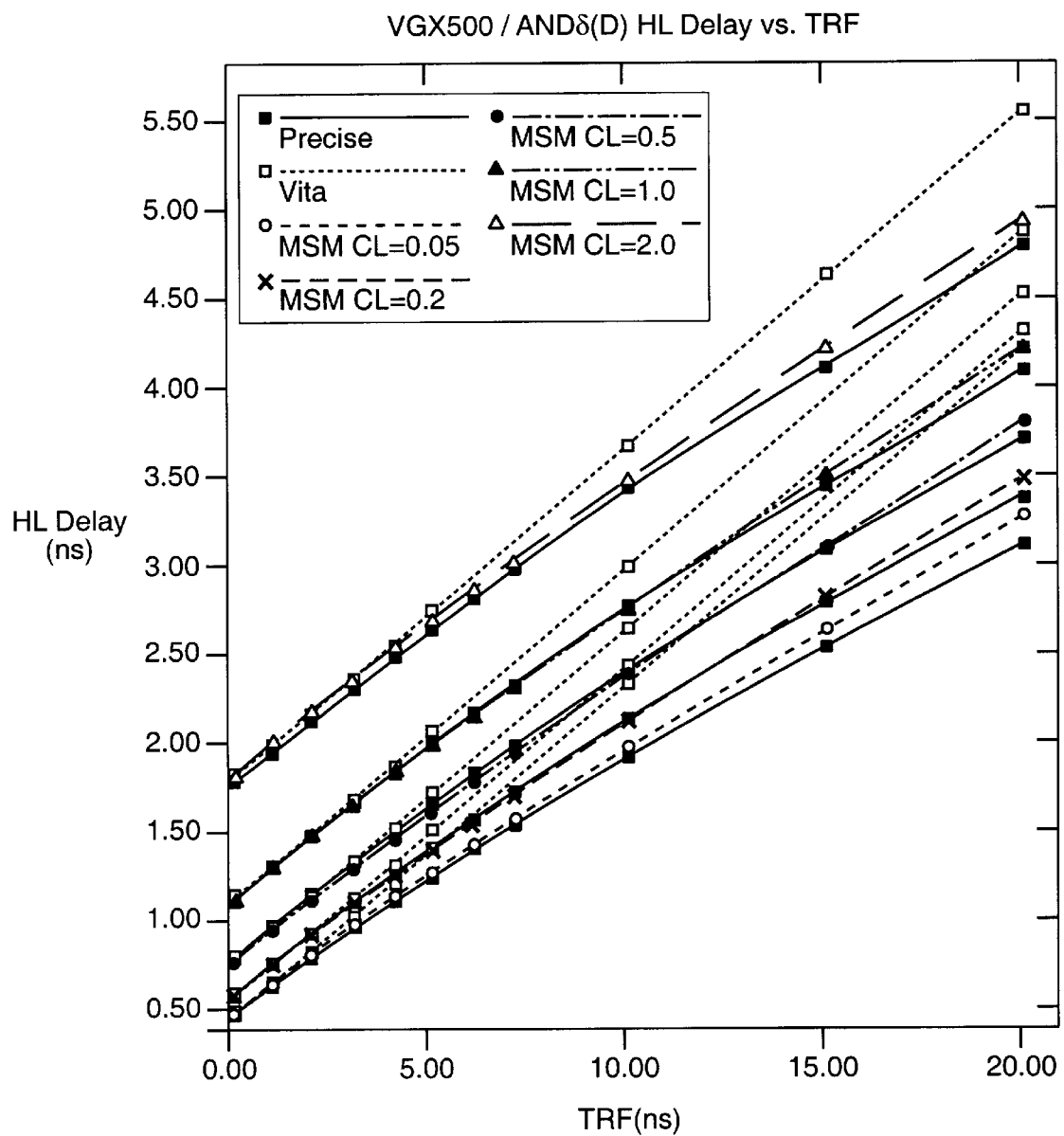
FIG._14

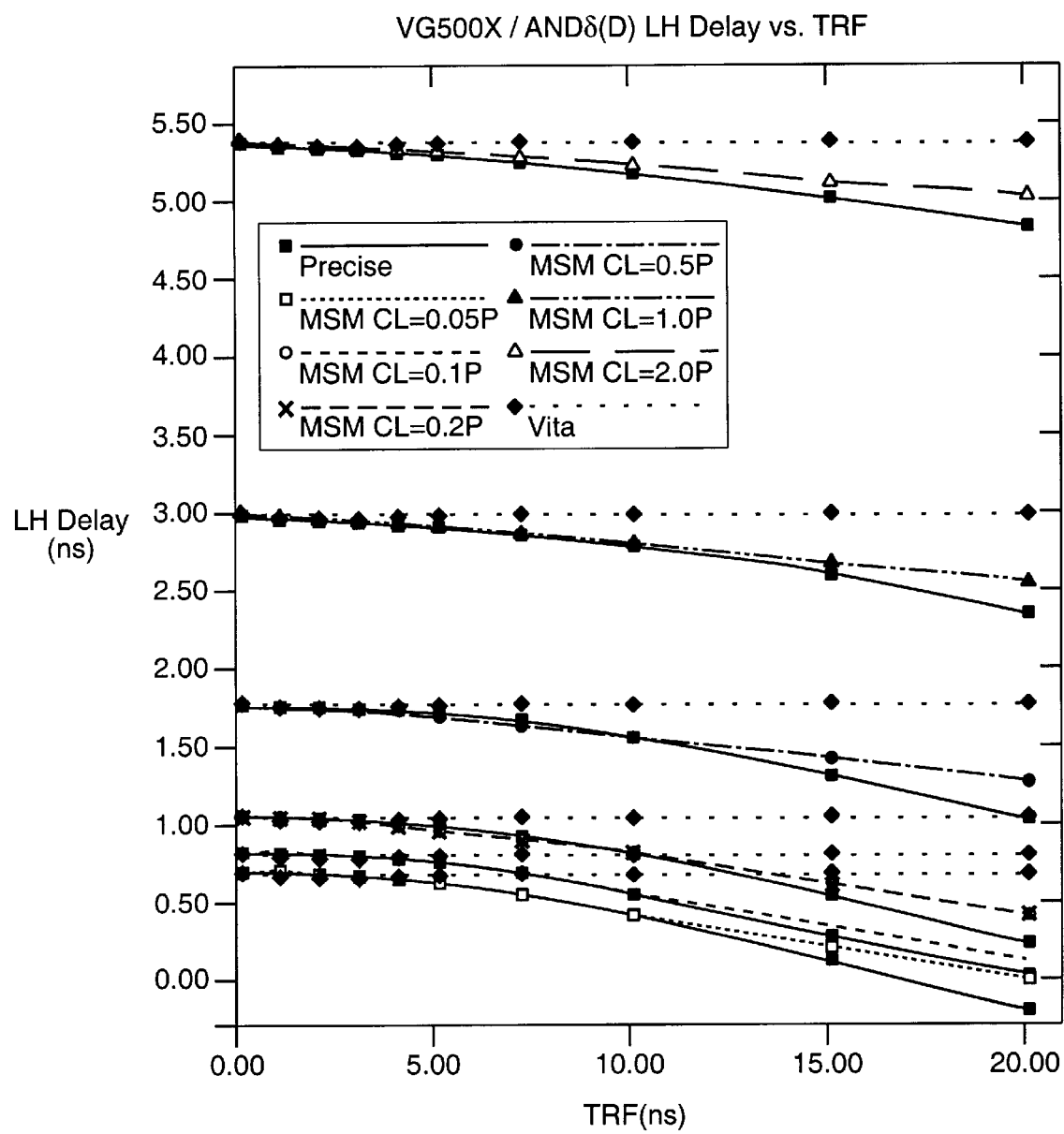
FIG._15

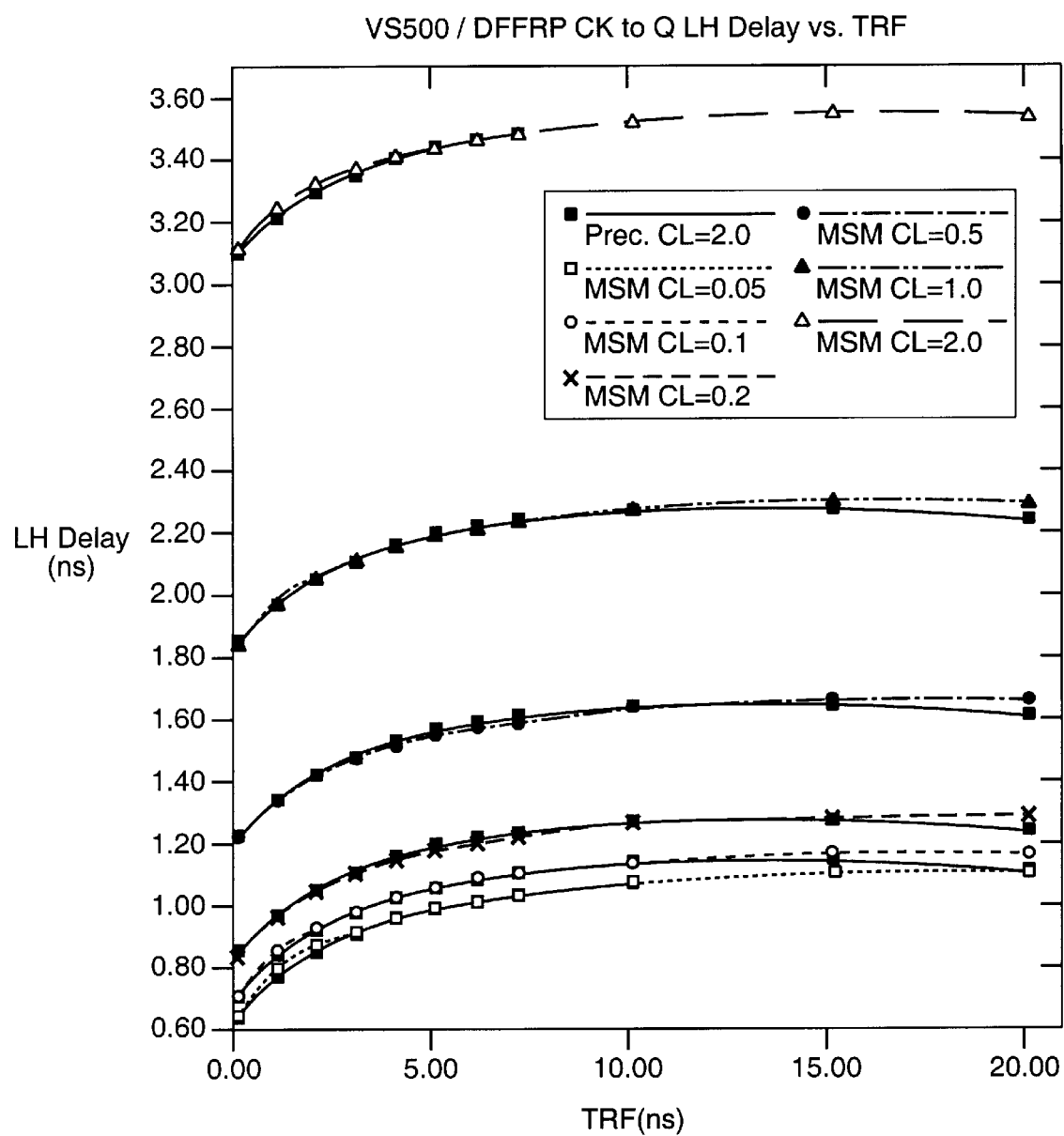
FIG._16

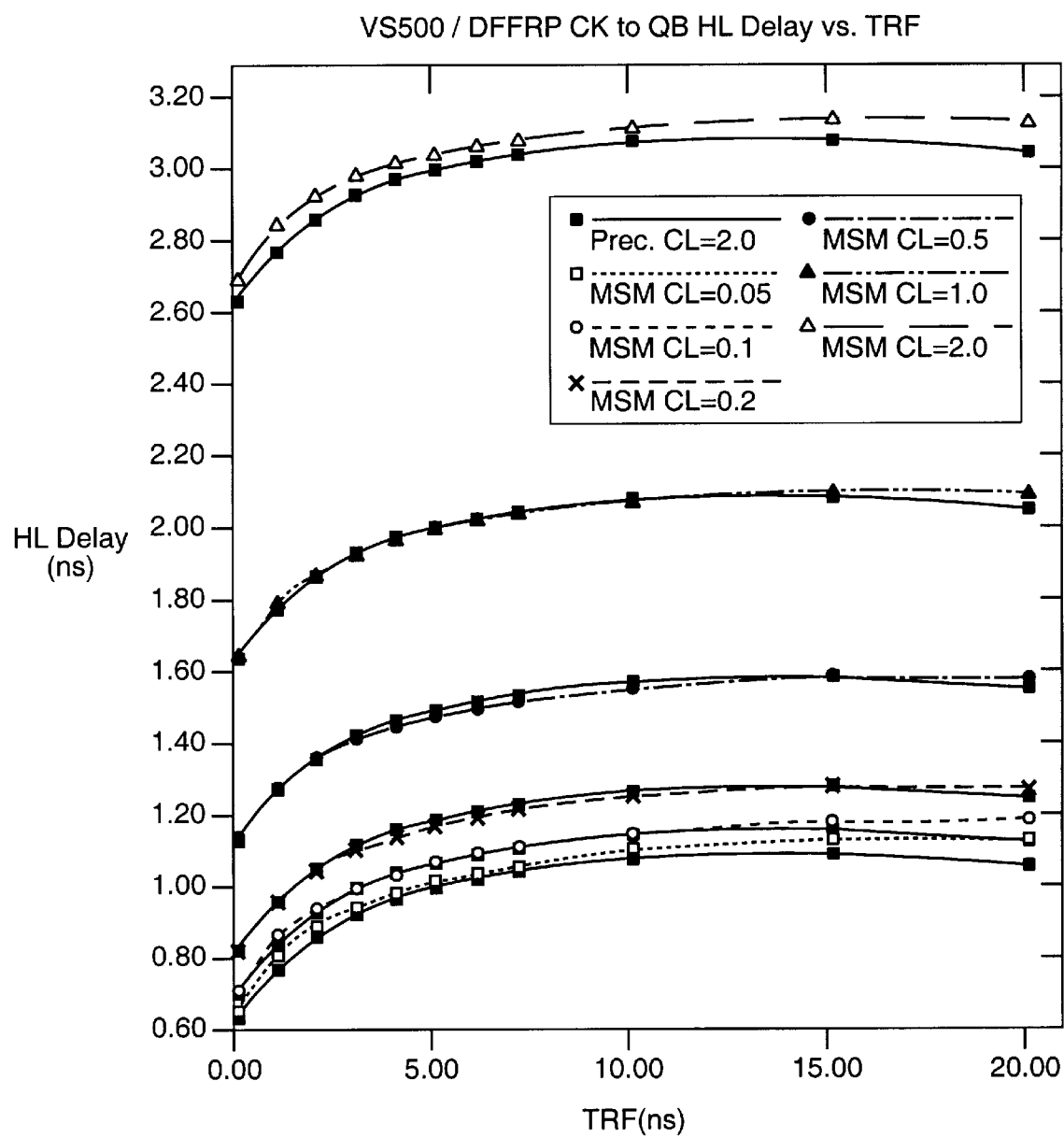
FIG._17

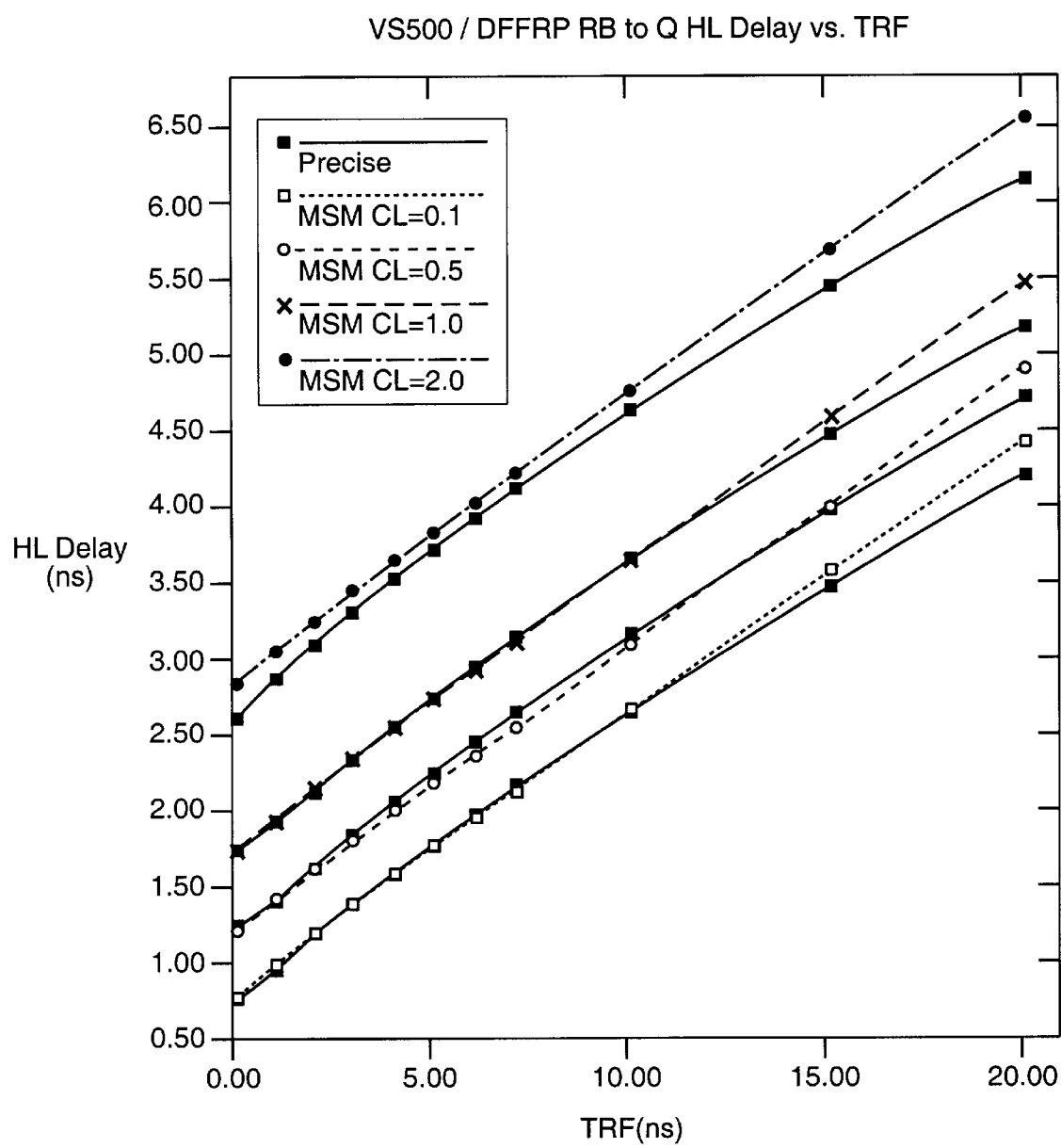
FIG._18

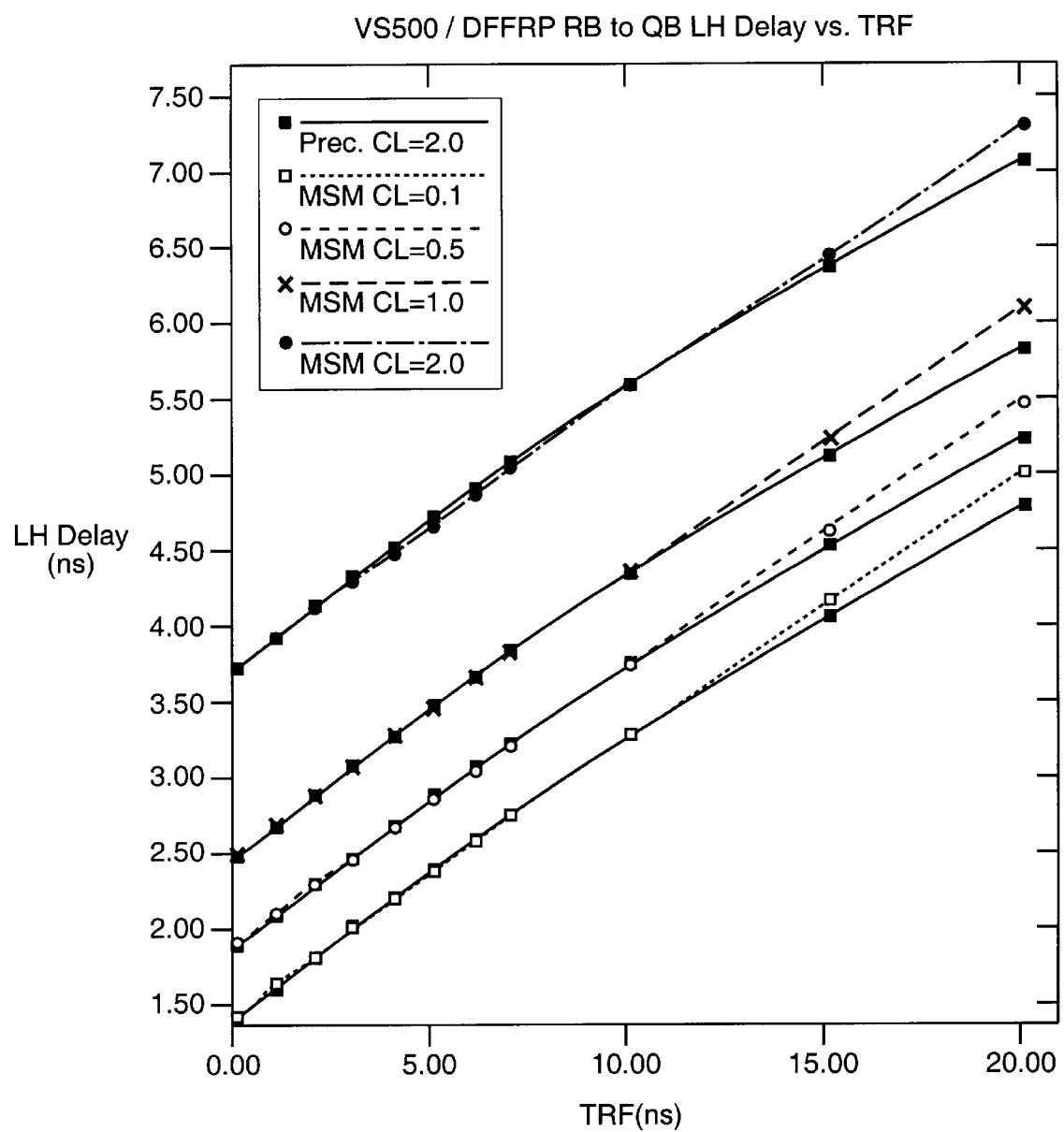
FIG._19

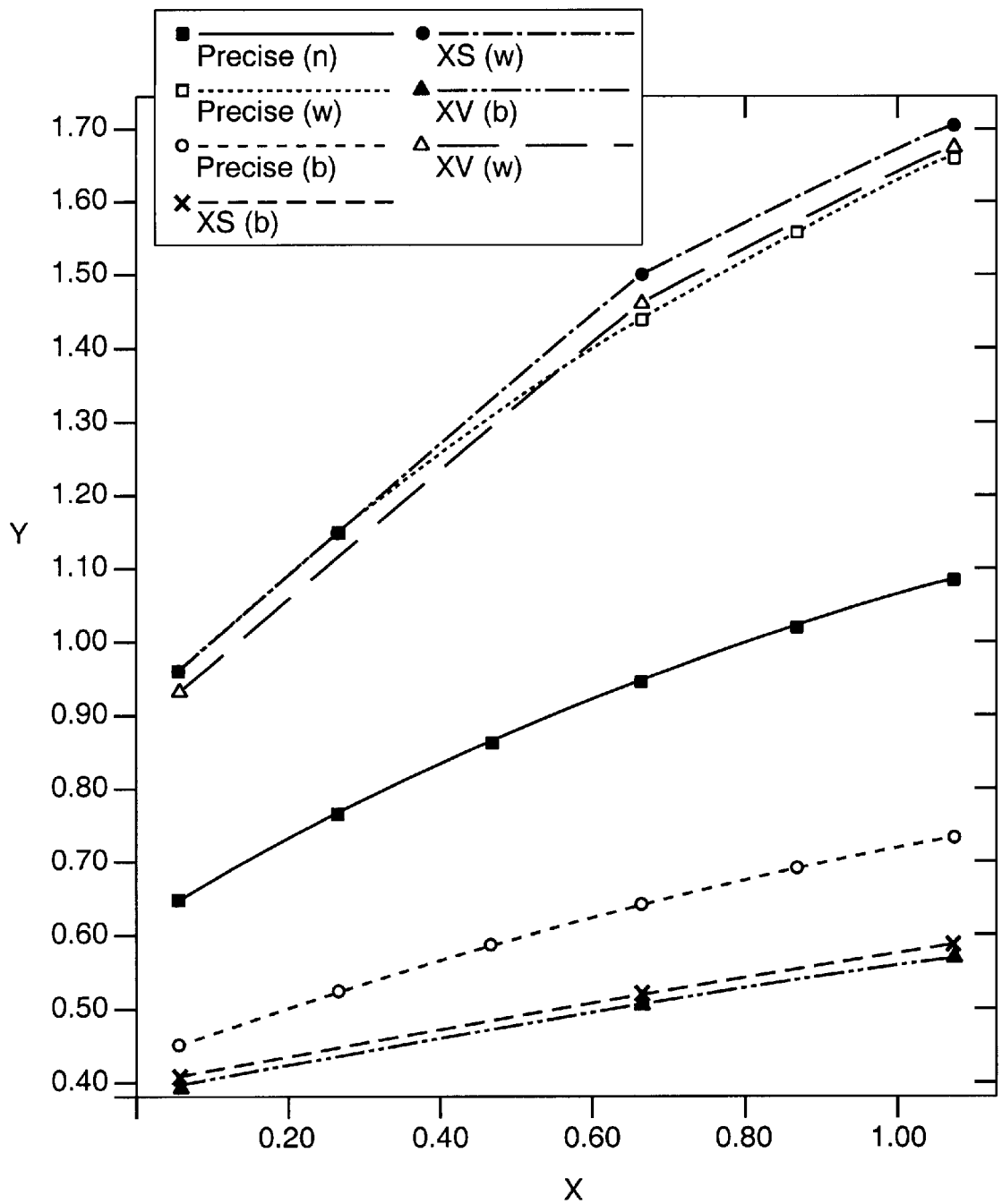
FIG._20

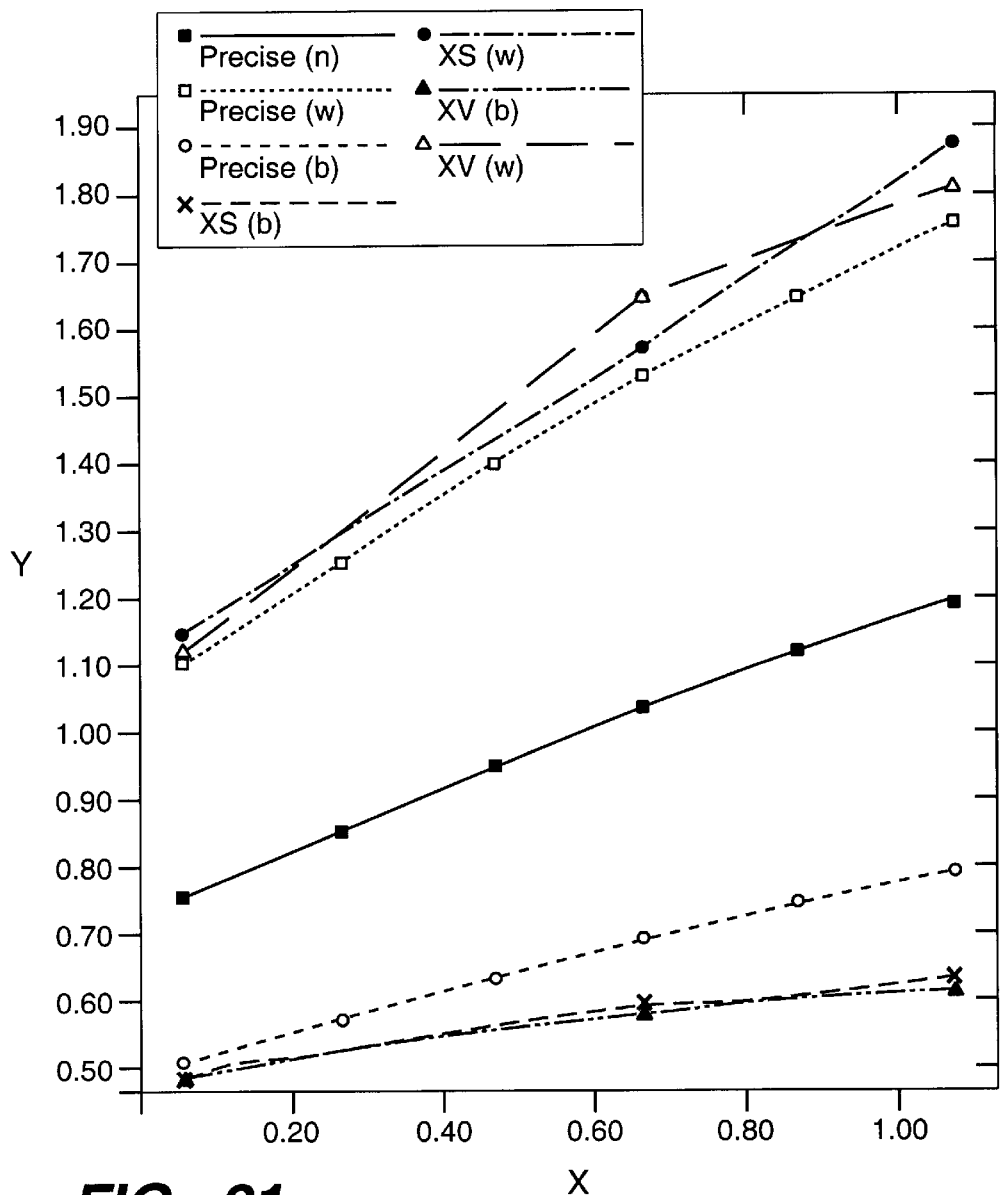
FIG._21
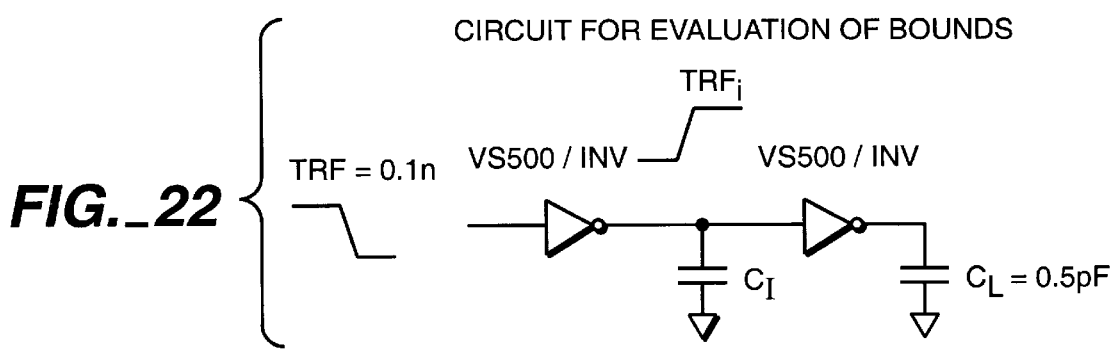
FIG._22

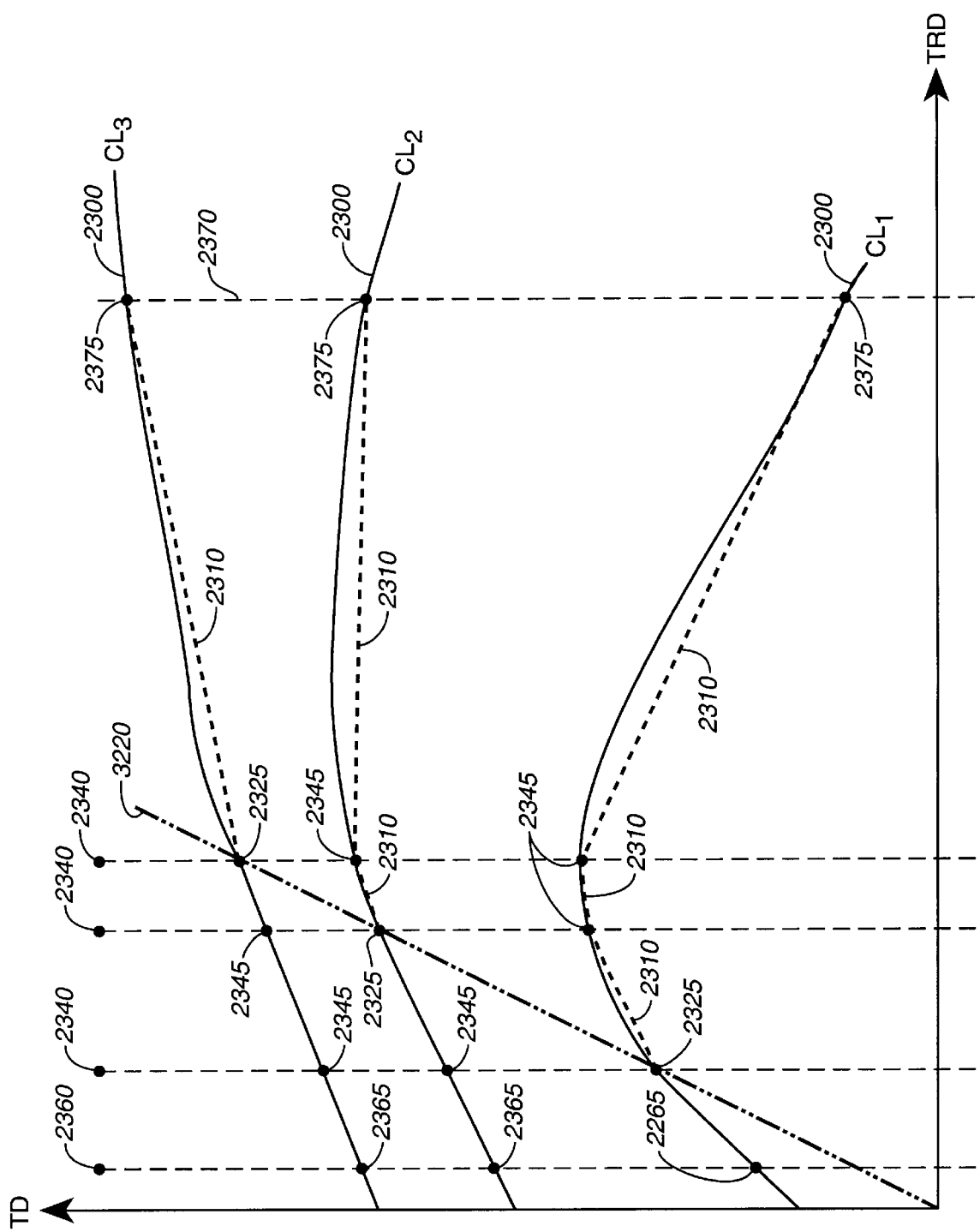
FIG._23

METHOD OF DETERMINING DELAY IN LOGIC CELL MODELS

FIELD OF THE INVENTION

The present invention relates generally to the modeling of digital logic cells such as standard cells and gate-array cells for simulation purposes and, more particularly, to a method of more accurately determining the signal-propagation delay associated with cell models of this kind.

BACKGROUND OF THE INVENTION

Timing models and delay calculations for integrated circuit cells are required for the design and implementation of an application specific integrated circuit ("ASIC") or an application specific standard product ("ASSP") integrated circuit ("IC"). Accurately characterized timing models are required to ensure that the ASIC or the ASSP implemented in silicon matches functional and timing specifications. Previous timing models were implemented as simple slope-intercept models that are a function of the output capacitance load. This function is based on simple first-order analysis of CMOS gate behavior. An example of such a model is:

$$TD = A + B*CL,$$

where TD is the time delay of a signal to propagate from the cell input to the cell output, A and B are delay coefficients extracted from transistor-level simulations and CL is the load capacitance.

These models were simple to implement and characterize for the design and verification process of ASICs or ASSPs. However, the accuracy of these linear models has become limited due to reductions in the process feature size (e.g., sub-micron) and the resulting prominence of second-order effects. The sub-micron CMOS gate delay is a nonlinear function of the input rise/fall time (also known as input slew rate) and the output load capacitance.

There are two approaches used to model and characterize this delay behavior: equations and tables. The equation model can be linear, exponential or a polynomial with a number of coefficients. The equation model can be based on curve fitting the simulated behavior of the cell or can be based on the inherent behavior of the CMOS cell. The inherent behavior corresponds to the physical properties of the cell. The analysis of circuit switching, however, is complex and is difficult to develop a closed form solution, except for a few special cases or when approximations are used in the analysis. In either case, the equation model can require a large number of coefficients and is difficult to characterize. Also, the approximations used to model the inherent behavior of the CMOS cell can limit the model accuracy or may not be valid for all of the integrated circuit cell types.

The other approach to characterizing and modeling the delay behavior is to use a table model which is a matrix of predetermined cell delay values based on various input rise/fall times and output load values. The cell delay value for specific input rise/fall times and output load values is then calculated by interpolating between the predetermined cell delay values. This essentially is a nonlinear curve fit to the cell behavior and can be accurate provided that there are sufficient predetermined cell delay values. Yet providing sufficient values requires a large number of predetermined cell delay values that impact characterization and implementation of the model in the design process. Despite this disadvantage, the nonlinear table model is the typical approach used by electronic design automation ("EDA") tools for the design of sub-micron integrated circuits, primarily because this is a more general and portable approach. Nonetheless, the efficient use of this nonlinear model does require limiting the total number of values in the models. As a result, accuracy is adversely affected.

Delay models can have qualified inaccuracies. Current linear logic-cell models, such as Symbios' VITA delay model for standard cells and gate-arrays, become inaccurate when a cell's input rise/fall time exceeds 2–3 ns. This is true for most cells, particularly under certain cell-specific load conditions.

This inaccuracy arises largely from the fact that these models are linear, whereas the dependence of cell delay on input rise/fall time is highly nonlinear. The VITA model, for example, uses the following equation for propagation delay (TD) calculations:

$$TD = A + B*CL + MC*MAX((TRF - 0.1), 0) \qquad (1)$$

where A, B, MC are VITA parameters, CL is the load capacitance, and TRF[1] represents the cell input rise/fall time. This equation is based on the following assumptions:

1) Propagation delay at a given load CL varies linearly with TRF;
2) Propagation delay varies linearly with CL for a given TRF; and
3) The contributions to the propagation delay due to TRF and CL are independent of each other, and can be included to obtain the total correction.

[1] For convenience, TRF is defined here as the peak-to-peak transition time. Alternate representations, such as 10%–90%, can be used without loss of generality.

These assumptions are valid in general only for small rise/fall times, typically less than 1–2 ns. Consider a simple cell such as an inverter. The input rise/fall time TRF determines how long it takes for the inverter to cross the threshold voltage, as well as the variation of transistor resistances during capacitive charging and discharging. The effective resistance is therefore a function of TRF, as is the effective time constant—the transistor on-resistance multiplied by the load capacitance. As a consequence, the above assumptions are not valid for rise/fall times exceeding a few ns.

FIGS. 1 and 2 illustrate cell propagation delay vs. TRF for different load values for high-to-low (HL) and low-to-high (LH) transitions, respectively. FIGS. 3 and 4 show, respectively, delay vs. CL for a Symbios VGX500/INV inverter for different TRF values for HL and LH transitions. It can be clearly seen that the actual delay vs. input TRF characteristics are nonlinear functions of TRF as well as CL. The nonlinearity is more significant when input low to high transitions are involved. For particular simulated cells, at the rated low load capacitance value and TRF=10 ns, the error corresponding to the linear model for input HL transitions ranged from 5 to 130%, and for input LH transitions, from 40–450%. These results are in no way unusual compared to characteristics for other cells in this and other libraries. Note also that these models are typically derived from transistor-level simulations, such as provided by SPICE. Although highly accurate, the delay calculated by transistor-level simulations require an excessive amount of computational time.

The need remains, therefore, for a method of accurately modeling cell delay, preferably over a wide range of rise and fall times, and also for a range of load conditions in both standard and gate-array libraries. The method should also use a minimum number of transistor-level simulation inputs to reduce the time required for that simulation. The present inventions meets this need.

SUMMARY OF THE INVENTION

The present invention improves upon existing logic-cell models by taking into account both linear and nonlinear effects in determining propagation delay, thereby providing improved accuracy as compared to existing models, particularly when rise/fall times exceed several nanoseconds. A delay model is created for a single-stage cell that identifies linear and nonlinear aspects of the cell delay. If the cell is multi-stage, a delay model is created that conforms to the delay characteristics, if the cell is multi-stage.

A method of the present invention also includes determining inflection points from the delay model and generating a delay table according to the inflection points. The step of generating a delay table includes substituting crossover or inflection points in the delay model to generate the delay table. Alternatively, the step of generating a delay table includes simulating a specific cell using the inflection points.

Broadly, and in general terms, given a logic cell of the type wherein the delay therethrough is a function of the input rise/fall time (TRF) and load capacitance (CL), the method involves choosing a plurality of discrete simulation points associated with the delay, each point also being a function of TRF and CL, and then determining the delay for specific TRF and CL in accordance with the chosen simulation points.

In a preferred embodiment, one or more of the simulation points are chosen in conjunction with both the linear and nonlinear regions of the TRF/CL space to ensure accuracy for a wide range of TRF and/or CL values. In the event of an identifiable or discontinuous transition between the linear and nonlinear regions, the step of choosing a plurality of discrete simulation points associated with the delay preferably includes choosing a point associated with that transition.

In one example, the following transistor-level simulation points are chosen with respect to a single-stage cell:
a) a first simulation point corresponding to low values of TRF and CL;
b) a plurality of simulation points, each corresponding to a low TRF value and a moderate to high value of CL; and
c) a plurality of different simulation points, each corresponding to a high TRF value and a low value of CL.

In the preferred implementation, one point is selected corresponding to low TRF and CL values, two points are selected corresponding to a low TRF value and a moderate to high value of CL, whereas three points are chosen which correspond to a high TRF value and a low value of CL.

Based upon the simulation points, a curve-fitting equation and its constants or coefficients are determined. These constants or coefficients are then, in turn, used to solve for propagation delay on a more accurate basis. In particular, the curve-fitting equation is used to determine specific delay coordinates, such as the coordinates for the crossover points at the transition, that include input rise/fall times and output load capacitance.

A table model is then created using delay values that correspond to those coordinates. The table model can be created by substituting the coordinates in the curve-fitting equation to determine the corresponding delay values. Alternatively, the cell model can be resimulated, for example by SPICE, using those coordinates to determine the corresponding delay values. Resimulating the cell model is preferred when delay values are desired that are more accurate than the delay values derived from the curve-fitting equation.

The propagation delay, TD, may be determined in accordance with the curve-fitting equation $$TD = A + B*CL + C*TRF + E(TRF, CL),$$

where A, B and C are constants derived from the simulation points, and E(TRF,CL) represents a correction factor associated with the nonlinear effects. More particularly, for single-stage cells:

$$E(TRF, CL) = 0 \quad \text{if } TRF < K*CL$$

$$= (D*TRF*CL) + (G*TRF^2)^{1/2} -$$
$$B*CL - F*TRF$$
$$\quad \text{if } TRF > K*CL;$$

and for multi-stage cells:

$$E(TRF,CL) = D*(TRF)^{1/2} + (G*TRF + F*(TRF)^{1/2})/(Max(CL,cl))_{1/2}.$$

BRIEF DESCRIPTION OF THE DRAWINGS

FIG. 1 is a plot of HL delay vs. rise/fall time for a particular inverter;

FIG. 2 is a plot of LH delay vs. rise/fall time for the inverter of FIG. 1;

FIG. 3 is a plot of HL delay vs. load capacitance for the inverter of FIGS. 1 and 2;

FIG. 4 is a plot of LH delay vs. load capacitance for the inverter of FIGS. 1–3;

FIG. 5 is a drawing which illustrates single-stage vs. multi-stage paths in a logic cell;

FIG. 6 is a plot of HL delay vs. rise/fall time illustrating how the single-stage version of the inventive model more accurately tracks delay;

FIG. 7 is a plot of LH delay vs. rise/fall time illustrating how the single-stage version of the inventive model more accurately tracks delay;

FIG. 8 is a plot of HL delay vs. rise/fall time for a VS500/INV inverter illustrating how the single-stage version of the inventive model more accurately tracks delay;

FIG. 9 is a plot of LH delay vs. rise/fall time for a VS500/INV inverter illustrating how the single-stage version of the inventive model more accurately tracks delay;

FIG. 10 is a plot of HL delay vs. rise/fall time for a VS500/NAN-2 NAND gate illustrating how the single-stage version of the inventive model more accurately tracks delay;

FIG. 11 is a plot of LH delay vs. rise/fall time for a VS500/NAN-2 NAND gate illustrating how the single-stage version of the inventive model more accurately tracks delay;

FIG. 12 is a plot of HL delay vs. rise/fall time for a VG500/BUFX buffer illustrating how the multi-stage version of the inventive model more accurately tracks delay;

FIG. 13 is a plot of LH delay vs. rise/fall time for a VG500/BUFX buffer illustrating how the multi-stage version of the inventive model more accurately tracks delay;

FIG. 14 is a plot of HL delay vs. rise/fall time for a VGX500/AND8(D) illustrating how the multi-stage version of the inventive model more accurately tracks delay;

FIG. 15 is a plot of LH delay vs. rise/fall time for a VGX500/AND8(D) illustrating how the multi-stage version of the inventive model more accurately tracks delay;

FIG. 16 is a plot of LH delay vs. rise/fall time for a VS500/DFFRP CK TO Q LH cell and further demonstrates the inventive model's ability to accurately track delay;

FIG. 17 is a plot of HL delay vs. rise/fall time for a VS500DFFRP CK TO Q LH cell and further demonstrates the inventive model's ability to accurately track delay;

FIG. 18 is a plot of HL delay vs. rise/fall time for a VS500/DFFRP RB TO Q HL cell and further demonstrates the inventive model's ability to accurately track delay;

FIG. 19 is a plot of LH delay vs. rise/fall time for a VS500/DFFRP CK TO Q LH cell and further demonstrates the inventive model's ability to accurately track delay;

FIG. 20 is a plot of best, worst and nominal HL delay for a VS500/INV cell vs. input capacitance and illustrating scalability of the inventive model;

FIG. 21 is a plot of best, worst and nominal LH delay for a VS500/INV cell vs. input capacitance and illustrating scalability of the inventive model;

FIG. 22 is an electrical circuit schematic used to illustrate how a pair of inverters in series may be used for the evaluation of bounds: and FIG. 23 is a graphical representation of how points are chosen for delay calculations of the present invention.

DETAILED DESCRIPTION OF THE INVENTION

In a logic model, the relationship between cell delay TD, input rise/fall time TRF and load capacitance CL depends on the structure of the input-output path of the cell. In a single-stage cell, there is only a single logic gate in the input-to-output path. Inverters, NANDs and NORs (INV, NAN2 and NOR2) are examples of single-stage cells where all the input-output paths may have only one stage. Cells such as buffers, flip-flops and ANDS usually have multiple stages in their input-output paths, i.e. each input-output path goes through more than one logic gate. There are few cells ( e.g., tristate buffers) which contain both single-stage and multi-stage paths. Generally speaking, the invention seeks to realize the following performance goals:

TABLE I

| TRF Range | Accuracy |
|---|---|
| TRF < 2ns | 95% |
| 2ns < TRF < 5ns | 90% |
| TRF > 5ns | 80% |

Consider a two-stage cell such as BUFX 500 (FIG. 5). In this case, the effect on delay due to TRF and CL is more independent compared to a single-stage cell. This is true since the input or first stage 510 of the cell sees a constant load (CI) that is independent of the cell output load CL. The delay of the first stage 510 is therefore not a function of CL. The TRF seen by the second stage 520 (TRFi), however, depends to a certain extent on the input TRF. When the variation of TRFi is considered with respect to that of TRF, the former is only a fraction (<35%) of the variation of TRF. For example, changing the TRF from 1 to 20 ns would change TRFi by less than 7 ns. Thus the effect due to input rise/fall time TRF on the delay characteristics of the second stage 520 is smaller compared to that on the first stage 510. As more stages are used, the effect of TRF has on the cell delay is decreased.

The delay of the second stage 520, however, depends on the output load capacitance CL. A similar analysis holds for all multi-stage cells. In case of a single-stage cell such as an inverter or a NAND gate, the delay depends in a complex manner on TRF and CL. Therefore it is necessary to consider single-stage and multi-stage input-output cells separately for the purpose of delay evaluation.

A Delay Model for Single Stage Paths (SSM)

The switching speeds of NMOS inverters are modeled in Wan, E., "Switching Speeds of MOS Inverters," *IEEE Journal of Solid State Circuits.* Vol. SC-15. No. 2. April 1980. According to the present invention, extending this analysis to CMOS yields the following model for the delay of an inverter (or any single-stage cell):

$$TD = a + d^*TRF + b^*TRF^*CL + c^*TRF^2 \quad \text{for } CL < k^*TRF \quad (2)$$

$$= a + p^*TRF + q^*CL \quad \text{for } CL > k^*TRF \quad (3)$$

Coefficients a, b, c, p, and q are found using a plurality of appropriately selected transistor-level simulation points (preferably 6), and k is a function of these coefficients. Selection of these simulation points is described in further detail below. Equations 2 and 3 form the single-stage model.

FIGS. 6 to 11 show the results obtained by the SSM, Precise™ simulations and VITA for the following cells: VGX500/INV, VS500/INV, VS500/NAN2. SSM is shown as dashed lines, Precise™ (transistor-level) simulations are shown as solid lines and VITA simulations are shown as dotted lines. As these results indicate, SSM very accurately models the dependence of the delay TD on the load CL and the input rise/ fall time TRF. These results further indicate that for a given load capacitance CL, the delay vs. TRF characteristics are linear up to a certain value of TRF, but then become nonlinear as shown. The linear approximation (Equation 3) thus is valid for a larger range of TRFs at high load capacitances CL, but for a smaller range at low load capacitances CL.

A Delay Model for Multi-Stage Paths (MSM)

For multistage cells, the invention preferably uses the following equation for the MSM:

$$TD = a + b^*CL + p^*TRF + q^*TRF^{1/2} + (r^*TRF + s^*TRF^{1/2})/(Max(CL, cl))^{1/2} \quad (4)$$

where cl is the low-load capacitance value recommended for the cell. The term b *CL represents the delay of the last stage assuming a small, fixed input rise time to that stage. The terms $p^*TRF + q^*TRF^{1/2}$ represent the delay component due to the first stage. The last two terms $r^*(TRF/(Max(CL,cl)))^{1/2} + s^*TRF/(Max(CL,cl))^{1/2}$ were found to provide the correction necessary since the rise and fall times internal to the cell depend on the input rise/fall times. Note that these two terms become negligible at small TRF values and large CL values.

FIGS. 12–19 compare the results provided by the multi-stage model (MSM—in the dashed lines) with VITA (dotted lines) and transistor-level simulation results (solid lines) for several multi-stage cells. The multi-stage cells examined were Symbios VS500/BUFX, VGX500/AND8 and VS500/DFFRP. The cells selected represent the different configurations that are typically encountered in cell libraries.

Alternative Representation

Both the single- and multi-stage models may be expressed in the following format:

$$TD = A + B^*CL + C^*TRF + E(TRF, CL) \quad (5)$$

where TD is the time delay of the cell, A, B and C are coefficients determined for the transistor-level simulations and E(TRF,CL) represents a correction factor when accuracy beyond that provided by the linear model is desired.

For single-stage models, E(TRF,CL) takes on the form:

$$E(TRF, CL) = 0 \quad \text{if } TRF < K^*CL \quad (6)$$

$$= (D^*TRF^*CL + G^*TRF^2)^{1/2} - B^*CL - F^*TRF \quad \text{if } TRF > K^*CL$$

For multi-stage paths, E(TRF,CL) assumes the form:

$$E(TRF,CL) = D^*TRF^{1/2} + (G^*TRF + F^*TRF^{1/2})/(Max(CL,cl))^{1/2} \quad (7)$$

Evaluation of Model Parameters

The equations and respective coefficients for SSM and MSM can each be found preferably using six simulation points, which are preferably selected to maximize the accuracy of the models and the coefficients. While the specifications for transistor-level simulation points provided below serve this purpose, there are numerous other possibilities for the selection that will provide a high degree of accuracy. When a different pattern of simulation points is selected, the equations given below for parameter calculation may not be valid. However, the procedure used to derive these equations can be used to derive other appropriate equations.

Calculation of Parameters for SSM

This section describes the procedure for calculating the equation and respective coefficients for the SSM. The calculations are based on the transistor-level simulation propagation delay (TD) values $x_0$ to $x_5$ obtained for TRF and CL values as shown in Table 2 below.

TABLE 2

| SIMULATION PROPOGATION DELAY TD POINTS FOR SSM | | | | | | |
|---|---|---|---|---|---|---|
| CL(pF) | 0.01 | $c_1$ | $c_2$ | $c_3$ | $c_4$ | $c_5$ |
| TRF |  |  |  |  |  |  |
| 0.01 | $x_0$ |  |  |  |  |  |
| $t_1$ |  | $x_1$ | $x_2$ |  |  |  |
| $t_2$ |  |  |  | $x_3$ | $x_4$ | $x_5$ |

The selection of the appropriate values for $c_1$–$c_5$ and $t_1$, $t_2$ is important for the accuracy of the results. Note that while the input rise/fall times, $t_1$ and $t_2$, are generally independent of the circuit design, the value of $c_1$–$c_5$ depend greatly on the circuit design and the drive of the digital cell's output stage. It is thus expected that there will be a LOW LOAD and a HIGH LOAD value for each cell established by the circuit designer that defines the output minimum and maximum load capacitances CL that the cell is designed to function optimally between. For generality, the terms LOW LOAD and HIGH LOAD will be used to represent these values, regardless of cell type or drive strength. As the simulation point $x_0$ corresponds to TRF=0.01 ns and CL=0.01 pF, the contribution to delay due to the terms p and q are negligible. Therefore from Equation 3, $$TD = x_0 = a \quad (8)$$

Note that the linear Equation 3 is valid only for small values of TRF.

To calculate the appropriate values for p and q it is preferable to select simulation points in the linear region. At higher loads, the linear region (delay vs TRF) is large. Therefore, the simulation points $x_1$, $X_2$ should be selected at low TRF values (and at moderate to high load values CL).

Values $t_1 = 1.1$ ns and $c_1 =$ HIGH LOAD; $c_2 = c_1 + 1$pF are selected to illustrate In general, $t_1$ should preferably be in the range of 0.1 to 1.5 ns, $c_1$ and $c_2$ should be selected closer to the higher end of the range of capacitive loads for that cell. A very small gap between $c_1$ and $c_2$ will contribute to numerical errors. The values of $c_1$ and $c_2$ do not appear to be critical for any of the cells simulated, as long as TRF<1–1.5ns. If $t_1$ is selected closer to 0 (i.e., 0.1–0.3ns), $c_1$ and $c_2$ may be selected from the range LOW LOAD to HIGH LOAD.

When $x_1$, $X_2$ correspond to points in the linear region of the characteristics, from equation (3), $$x_1 = a + p^*t_1 + q^*c_1 \quad (9)$$

$$x_2 = a + p^*t_1 + q^*c_2 \quad (10)$$

Solving these, $$q = (x_1 - x_2)/(c_1 - C_2)$$

$$p = ((X_1 - a)C_2 - (X_2 a)c_1)/t_1(C_2 - C_l)$$

The nonlinear equation (2) is valid for large TRF values, though the term "large" depends on the load. The lower the load, the lower the value of TRF at which the nonlinear model becomes valid. Conversely, at higher loads, the nonlinear model may not be applicable for even TRF values approaching 10–15 ns. To ensure that the simulation points are selected in the nonlinear region of characteristics, $C_3$, $c_4$ and $c_5$ should be as low as possible, and $t_2$ should be large. Preferably, $c_3 =$ LOW LOAD, $c_4 =$ LOW LOAD+0.1pF, and $c_5 =$ LOW LOAD+0.2pF. The results in the previous section use these values for $c_3$–$c_5$ and $t_2 = 15.1$ ns.

When $x_3$, $x_4$ and $x_5$ are in the nonlinear region, from equation (3), $$X_3 = a + d^*t_2 + (b^*t_2^*C_3 + C^*t^2{}_2)^{1/2}$$

$$X_4 = a + d^*t_2 + (b^*t_2^*C_4 + C^*t^2{}_2)^{1/2}$$

$$X_5 = a + d^*t_2 + (b^*t_2^*C_5 + C^*t^2{}_2)^{1/2}$$

Solving these three equations for d yields:

$$d = ((c_3 - C_4)(x_4 - x_5)(x_4 + x_5 - 2a) - (C_4 - C_5)(x_3 - x_4)(x_3 - x_4)(x_3 + x_4 - 2a))/2t_2((c_3 - c_4)(x_4 - x_5) - (c_4 - C_5)(x_3 - x_4))$$

Knowing d, b can be calculated using $$b = ((x_3 - x_4)(x_3 + x_4 - 2a - 2dt_2))/t_2(c_3 - C_4)$$

Coefficient c can now be found using $$c = ((x_3 - a - dt_2)^2 - bt_2 c_3)/t^2{}_2$$

The value of k, which defines the crossover point from the linear equation to the nonlinear equation, depends on a,b,c, d,p, and q. Therefore, k can be found by substituting CL=k*t in Equations 2 and 3, where t is the value of TRF at the crossover point, and equating them, i.e., $$a + d^*t + (b^*k^*t^2 + c^*t^2)^{1/2} = a + p^*t + q^*k^*t \quad (19)$$

Let $k_1$, $k_2$ be the roots of this quadratic equation, i.e., $$k1, k2=(b-2q(p-d)\pm((2q(p-d)-b)^2-4q^2((p-d)^2-c))^{1/2})/2q^2$$

Then, $$k=Max(k_1,k_2) \quad (21)$$

Note that it is possible to find these parameters with a different arrangement of transistor-level simulation points in the [TRF,CL] space as long as those simulation points are selected in the appropriate regions.

Calculation of Parameters for MSM

The calculations associated with the MSM parameters are based on the simulation values $x_0$ to $x_5$ obtained at TRF and CL values as shown in Table 3 below.

TABLE 3

SIMULATION POINTS FOR MSM

| CL(pF) | $c_1$ | $c_2$ |
|---|---|---|
| TRF | | |
| $t_1$ | $x_1$ | $x_2$ |
| $t_2$ | $x_3$ | $x_4$ |
| $t_3$ | $x_5$ | $x_6$ |

The delays $x_1$ to $x_6$ are related to the parameters a, b, p, q, r and s of Equation 6, as follows:

$$x_1=a+bc_1+pt_1+qt_1^{1/2}+rt_1/c_1^{1/2}+st_1^{1/2}/c_1^{1/2}$$

$$x_2=a+bc_2+pt_1+qt_1^{1/2}+rt_1/c_2^{1/2}+st_1^{1/2}/c_2^{1/2}$$

$$x_3=a+bc_1+pt_2+qt_1^{1/2}+rt_1/c_3^{1/2}+st_1^{1/2}/c_3^{1/2}$$

$$x_4=a+bc_2+pt_2+qt_1^{1/2}+rt_1/c_4^{1/2}+st_1^{1/2}/c_4^{1/2}$$

$$x_5=a+bc_1+pt_3+qt_1^{1/2}+rt_1/c_5^{1/2}+st_1^{1/2}/c_5^{1/2}$$

$$x_6=a+bc_2+pt_3+qt_1^{1/2}+rt_1/c_6^{1/2}+st_1^{1/2}/c_6^{1/2}$$

The parameters a, b, p, q, r and s can thus be found by evaluating the following equations in sequence:

$$u=1/c_2^{1/2}-1/c_1^{1/2}$$

$$s=((x_1-x_2-x_3+x_4)(t_3-t_2)-(x_3-x_4-x_5+x_6)(t_2-t_1))/u((t_2^{1/2}-t_1^{1/2})(t_3-t_2)-(t_3^{1/2}-t_2^{1/2})(t_2-t_1))$$

$$r=((x_1-x_2-x_3+x_4)(t_3^{1/2}-t_2^{1/2})-(x_3-x_4-x_5+x_6)(t_2^{1/2}-t_1^{1/2}))/u((t_3^{1/2}-t_2^{1/2})(t_2-t_1)-(t_3^{1/2}-t_1^{1/2})(t_3-t_2))$$

$$b=((x_2-x_1-rt_1u-sut_1^{1/2}))/(c_2-c_1)$$

$$p=-r/C_1^{1/2}+((x_3-x_1)(t_3^{1/2}-t_2^{1/2})-(x_5-x_3)(t_2^{1/2}-t_1^{1/2}))/((t_3^{1/2}-t_2^{1/2})(t_2-t_1)-(t_2^{1/2}-t_1^{1/2})(t_3-t_2))$$

$$q=-s/C_1^{1/2}+((x_3-x_1)(t_3-t_2)-(x_5-x_3)(t_2-t_1)/((t_2^{1/2}-t_1^{1/2})(t_3-t_2)-(t_3^{1/2}-t_2^{1/2})(t_2-t_1))$$

$$a=x_1-(bc_1+pt_1+qt_1^{1/2}+rt_1/c_1^{1/2}+s(t_1/c_1)^{1/2})$$

As with the SSM, it is possible to obtain these parameters using a different arrangement of simulation points in the TRF, CL space. However, it is important to select the simulation points in such a way as to capture the delay characteristics completely. Preferably, $c_1$=LOWLOAD, $c_2$=HIGHLOAD, $t_1$=0.1 ns; $t_2$=3.1 ns and $t_3$=10.1 ns. It is also possible to manipulate the above equations further to express a,b,p,q,r and s solely in terms of $x_1$-$x_5$, $t_1$, $t_2$, $t_3$, $c_1$ and $c_2$.

Also note that although TRF is defined as the peak-to-peak time as opposed to 10% to 90% or some other alternate representation, this does not have any impact on the form of the equation. These alternate representations can be implemented by scaling the model coefficients appropriately, or by using scaled rise/fall times for $x_1$-$x_6$.

Best and Worst Case Delays using Derating Factors

The delay of the cell under nominal conditions is given by $$TD_{(n)}=f(TRF_{(n)},CL) \quad (30)$$

where $TRF_{(n)}$ is the nominal input rise/fall time and CL is the load capacitance. Note that the model provides accurate values given the input rise/fall time to the cell. In the case of the best and worst case delays, best/worst may be derived by scaling or derating the nominal delay model. Let $DF_{(b/w)}$ be the derating factor under the extreme condition (best/worst) considered. Thus, under the extreme condition, if the cell input rise/fall time is TRF, the delay is given by $$TD_{(b/w)}=DF_{(b/w)}*f(TRF,CL) \quad (31)$$

The rise/fall time of the input under the extreme condition however is given by $$TRF_{(b/w)}=DF_{(b/w)}*TRF_{(n)} \quad (32)$$

Therefore the delay under best/worst condition is given by $$TD_{(b/w)}=DF_{(b/w)}*f(DF_{(b/w)}*TRF_{(n)},CL) \quad (33)$$

Note that the factor DF within f( ) corresponds to the effect the driving cell has on the rise/fall input to the current cell. The first DF term models the effect of the present cell under best/worst conditions.

Transistor-level simulation vs. model values for the VS500/INV are given for the best and worst cases in FIGS. 20 and 21 respectively. The delays are X-Y delay of the circuit shown in FIG. 22. XS indicates the bounds obtained from SSM using transistor-level simulation-based $TRF_i$ values at axis Y. XV indicates the same bounds obtained from SSM when $TRF_i$ values used are obtained from VITA rise/fall equations. Though not presented here, the inaccuracies associated with derating from nominal can largely be avoided by simulating under best/worst conditions instead. The same equations and derivation method for fitting the model to nominal can be equally applied to best/worst conditions.

FIG. 23 illustrates one aspect of the present invention. Solid lines 2300 in FIG. 23 represent transistor-level simulation delay values for a specific single-stage cell. Some of those values could be generated from the preferred six simulation points described above. Small dashed lines 2310 represent portions of the SSM that model the cell delay. Other portions of SSM overlap solid lines 2300 as the SSM approaches the TD axis. The overlapped portions represent the linear regions of the SSM.

Varied-dashed line 3220 intersects lines 2300 at crossover points 2325. In particular, crossover points 2325 represent K, which equals CL÷TRF. Crossover points 2325 are located at the transition between the linear and nonlinear regions of lines 2300. Lines 2340 are defined by crossover points 2325. The intersection of lines 2340 with lines 2300 define points 2345. Lines 2360 and 2370 are defined by choosing low and high values for TRF, respectively. Points 2365 and 2375 are defined at the respective intersections of lines 2360 and 2370 with lines 2300.

The selection of points 2325, 2345, 2365 and 2375 has many advantages. To illustrate, curve 2300 for $CL_1$ is less linear than curve 2300 for $CL_2$, which is less linear than curve 2300 for $CL_3$. As a result, more points are required to accurately interpolate curve 2300 for $CL_1$ between associated points 2325 and 2375 than are required for curve 2300 for $CL_3$ between associated points 2325 and 2375.

As shown in FIG. 23, choosing crossover points 2325 at the transition between linear and nonlinear regions provides for more points to accurately interpolate curves 2300 where needed. As a result, a table model can be created that includes points 2325, 2345, 2365 and 2375. These points can be used to accurately interpolate for input TRF and CL values for a specific cell. Accordingly, the corresponding table model will not require many table entries.

Alternatively, if it is desired to check the accuracy of the SSM model or to have greater accuracy than provided by the SSM, points 2325, 2345, 2365 and 2375 with their corresponding coordinates TRF, CL can be used as inputs for a transistor-level simulation. In this manner, the delay values generated from that simulation will provide table values that will accurately interpolate input TRF and CL values.

The method of the present invention also provides for use of fewer transistor-level simulation points to accurately fit delay over the TIC, CL space. This in turn save characterization time of the cell, and ultimately the library that includes that cell. Otherwise, the library characterization requires careful selection for generation of transistor-level simulation points to populate a table model. One could simply decide to be less careful and use more transistor-level simulation points to increase the number of entries in a table model. This means that more simulations are required, which translates into longer library characterization time. In addition, many table-based delay calculators limit the number of entries in a table.

Some of the advantages of the present invention can be summarized as follows. The present invention requires fewer transistor-level simulations to achieve accurate tunings versus characterizing an M×N table. This speeds library characterization time as a result of the fewer simulations.

Also, the method of the present invention describes delay timing as having linear and nonlinear regions, how to characterize and model both regions and how to calculate the intersection between regions. Therefore, the method can be used to improve the selection of table entries, which can be used to populate table-based delay calculation schemes that are widely accepted in the ASIC industry and supported by EDA vendors. The method also provides accurate nonlinear timing through computation that can fit true nonlinear delay curves better than linear or piece-wise linear methods.

The method of the present invention accurately models the cell delay with a high degree of accuracy across a large TRI, CL space, particularly for TRF values exceeding several nanoseconds. The models of the present invention can be used to fit best, nominal and worst case conditions, or scaled (derated) from one condition to another while maintaining accuracy.

Summarizing, the models according to the invention provide accurate delay values given the rise/fall time and the load. The single-stage and multi-stage paths of a cell are treated differently for calculating the delay, preferably with six transistor-level simulation points being used to evaluate the model parameters. The model parameters are not very sensitive to the simulation points as long as the simulation points are selected in the appropriate regions of the (TRF, CL) space. The model predicts both positive and negative delay values. Once the method is implemented, the main source of error left will be due to the calculation of rise/fall time using the VITA equation TRF=R2*CL. A more accurate first order model would be:

$$TRF=R1+R2*CL+R3*TRF_1 TRF_1>K;$$

and $$TRF=R1+R2*CL\ TRF_1 \leq K,$$

where K is the transition value of $TRF_1$ when the output slope changes from a simple load dependence to a ramp follower, and TRF, is the input ramp to the cell.

The above-described invention can be implemented using a workstation, such as that available from Sun Microsystems. It is preferred that the device used is equivalent to a Sparc10 or Sparc20. Alternatively, any device that can compute the necessary calculations of the present invention may be used.

We claim:

1. A method of simulating the timing of an integrated circuit by predicting the propagation delay of a signal through a logic cell of the type wherein the delay is a function of a rise/fall time TRF and load capacitance (CL), the method comprising the steps of:

choosing a plurality of discrete simulation points defined at least in part by particular values of TRF and CL;

determining the delay for each of the chosen simulation points, thereby generating a plurality of delay values;

using the plurality of delay values to predict the propagation delay for values of TRF and CL other than the particular values of TRF and CL associated with the plurality of discrete simulation points; and using the predicted propagation delays to simulate the timing of an integrated circuit.

2. The method of claim 1, wherein the delay as a function of TRF and CL exhibits a transition between a linear region and a nonlinear region, and wherein the step of choosing a plurality of discrete simulation points associated with the delay includes choosing one or more points associated with the linear region and one or more points associated with the nonlinear region.

3. The method of claim 1, wherein the delay as a function of TRF and CL exhibits a transition between a linear region and a nonlinear region, and wherein the step of choosing a plurality of discrete simulation points associated with the delay includes choosing one or more points associated with the transition between the linear and nonlinear regions.

4. The method of claim 1, wherein the logic cell is a single-stage cell.

5. The method of claim 4, wherein the step of choosing a plurality of discrete simulation points includes choosing the following points:

a) a first simulation point corresponding to values of TRF within a first range and CL value within a second range;

b) a plurality of different simulation points, each corresponding to a TRF value within the first range and a value of CL within a third range, each of the values in the third range being higher than any value in the second range; and c) a plurality of different simulation points, each corresponding to a TRF value within a fourth range and a value of CL within the second range, each of the values in the fourth range being higher than any value in the first range.

6. The method of claim 1, wherein the logic cell is a multi-stage cell.

7. The method of claim 1, further including the step of determining a plurality of constants in accordance with the simulation points, and wherein the step of solving for the propagation delay incorporates the constants.

8. A method of simulating the timing of an integrated circuit by predicting the propagation delay of a signal through a logic cell which accounts for both linear and nonlinear effects, the cell being of the type wherein the delay is a function of a rise/fall time TRF and load capacitance (CL), the method comprising the steps of:

choosing a plurality of discrete simulation points defined at least in part by particular values of TRF and CL;

determining the delay TD for each of the chosen simulation points, thereby generating a plurality of delay values;

solving for constants in an equation based on the plurality of discrete simulation points and associated plurality of delay values, wherein the equation is $$TD = A + B*CL + C*TRF + E(TRF,CL),$$

where A, B, C and E are the constants based on the plurality of discrete simulation points and associated plurality of delay values, and E(TRF,CL) is a correction factor associated with the nonlinear effects; and using the equation to simulate the timing of an integrated circuit.

9. The method of claim 8, wherein, for single-stage cells:

$$E(TRF, CL) = 0 \quad \text{if } TRF < K^*CL$$
$$= (D^*TRF^*CL + E^*TRF^2)^{1/2} - B^*CL - F^*TRF \quad \text{if } TRF > K^*CL.$$

10. The method of claim 8, wherein, for multi-stage cells:

$$E(TRF,CL) = D^*(TRF)^{1/2} + (E^*TRF + F^*(TRF)^{1/2})/(\text{Max}(CL,cl))^{1/2}.$$

* * * * *